US012488752B2

(12) United States Patent
Kusunoki et al.

(10) Patent No.: US 12,488,752 B2
(45) Date of Patent: Dec. 2, 2025

(54) DISPLAY APPARATUS AND METHOD FOR DRIVING THE DISPLAY APPARATUS

(71) Applicant: SEMICONDUCTOR ENERGY LABORATORY CO., LTD., Atsugi (JP)

(72) Inventors: Koji Kusunoki, Kanagawa (JP); Tomoaki Atsumi, Kanagawa (JP); Susumu Kawashima, Kanagawa (JP); Motoharu Saito, Kanagawa (JP); Hidetomo Kobayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/726,496

(22) PCT Filed: Jan. 13, 2023

(86) PCT No.: PCT/IB2023/050299
§ 371 (c)(1),
(2) Date: Jul. 3, 2024

(87) PCT Pub. No.: WO2023/144644
PCT Pub. Date: Aug. 3, 2023

(65) Prior Publication Data

US 2025/0182685 A1 Jun. 5, 2025

(30) Foreign Application Priority Data

Jan. 28, 2022 (JP) ................................ 2022-011804

(51) Int. Cl.
*G09G 3/3233* (2016.01)
*H10K 59/35* (2023.01)

(52) U.S. Cl.
CPC ... *G09G 3/3233* (2013.01); *G09G 2300/0842* (2013.01); *G09G 2310/08* (2013.01); *G09G 2320/0257* (2013.01); *H10K 59/35* (2023.02)

(58) Field of Classification Search
CPC ......... G09G 3/2025; G09G 2300/0443; G09G 2310/0205; G09G 2310/0216
See application file for complete search history.

(56) References Cited

U.S. PATENT DOCUMENTS 7,907,137 B2 3/2011 Shirasaki et al.
8,933,865 B2 1/2015 Kishi
(Continued)

FOREIGN PATENT DOCUMENTS

CN 001989539 A 6/2007
CN 103168324 A 6/2013
(Continued)

OTHER PUBLICATIONS

International Search Report (Application No. PCT/IB2023/050299) Dated Mar. 20, 2023.
(Continued)

*Primary Examiner* — Kevin M Nguyen
(74) *Attorney, Agent, or Firm* — NIXON PEABODY LLP; Jeffrey L. Costellia

(57) ABSTRACT

A method for driving a novel display apparatus is provided. The method is a method for driving a display apparatus including a first layer and a second layer over the first layer. The first layer includes a plurality of driver circuit regions. The second layer includes a plurality of display regions. Each of the plurality of driver circuit regions includes a driver circuit. Each of the plurality of display regions includes a plurality of pixels. Each of the plurality of pixels includes a light-emitting element. The driver circuit included in one of the plurality of driver circuit regions has
(Continued)

a function of driving each of the plurality of pixels included in one of the plurality of display regions. The method for driving the display apparatus includes: performing a first operation in which an operation of sequentially writing an image signal row by row in each of the plurality of display regions is performed and the operation is performed in all the plurality of display regions at the same time; performing a second operation in which the light-emitting elements included in the plurality of pixels are brought into a light-emitting state simultaneously after the first operation; and performing a third operation in which the light-emitting elements included in the plurality of pixels are brought into a non-light-emitting state simultaneously after the second operation.

10 Claims, 18 Drawing Sheets

(56) References Cited

U.S. PATENT DOCUMENTS

| | | | | |
|---|---|---|---|---|
| 11,423,844 | B2 | 8/2022 | Ikeda et al. | |
| 11,798,491 | B2 | 10/2023 | Ikeda et al. | |
| 2006/0221015 | A1 | 10/2006 | Shirasaki et al. | |
| 2007/0030219 | A1 | 2/2007 | Park et al. | |
| 2013/0181969 | A1 | 7/2013 | Kishi | |
| 2017/0178586 | A1* | 6/2017 | Kim | G09G 3/003 |
| 2018/0226037 | A1 | 8/2018 | Zhang et al. | |
| 2021/0295780 | A1 | 9/2021 | Ikeda et al. | |
| 2024/0062724 | A1 | 2/2024 | Ikeda et al. | |

FOREIGN PATENT DOCUMENTS

| | | | |
|---|---|---|---|
| CN | 106023923 | A | 10/2016 |
| CN | 112119446 | A | 12/2020 |
| JP | 2002-214645 | A | 7/2002 |
| JP | 2006-284716 | A | 10/2006 |
| JP | 2021-128194 | A | 9/2021 |
| KR | 2006-0115203 | A | 11/2006 |
| KR | 2017-0077921 | A | 7/2017 |
| KR | 2021-0007989 | A | 1/2021 |
| WO | WO-2006/104259 | | 10/2006 |
| WO | WO-2012/053462 | | 4/2012 |
| WO | WO-2018/010293 | | 1/2018 |
| WO | WO-2019/220278 | | 11/2019 |
| WO | WO-2021/161773 | | 8/2021 |

OTHER PUBLICATIONS

Written Opinion (Application No. PCT/IB2023/050299) Dated Mar. 20, 2023.

* cited by examiner

DISPLAY APPARATUS AND METHOD FOR DRIVING THE DISPLAY APPARATUS

TECHNICAL FIELD

One embodiment of the present invention relates to a display apparatus and a method for driving the display apparatus.

Note that one embodiment of the present invention is not limited to the above technical field. The technical field of one embodiment of the invention disclosed in this specification and the like relates to an object, a method, a driving method, or a manufacturing method. Alternatively, one embodiment of the present invention relates to a process, a machine, manufacture, or a composition of matter. Thus, specific examples of the technical field of one embodiment of the present invention disclosed in this specification and the like include a semiconductor device, a display apparatus, a light-emitting apparatus, a power storage device, an optical device, an imaging device, a lighting device, an arithmetic device, a control device, a memory device, an input device, an output device, an input/output device, a signal processing device, an electronic computer, an electronic device, driving methods thereof, and a manufacturing methods thereof.

BACKGROUND ART

In recent years, higher-resolution or higher-definition display panels have been required. Examples of devices that require high-resolution display panels include a smartphone, a tablet terminal, and a notebook computer. In addition, higher resolution has been required for a stationary display device such as a television device or a monitor device with an increase in definition. Furthermore, a device for virtual reality (VR) or augmented reality (AR) is given as an example of a device that is required to have the highest resolution.

Examples of display apparatuses applicable to such devices include a liquid crystal display apparatus and a light-emitting apparatus including a light-emitting element such as an organic EL (Electro Luminescence) element or a light-emitting diode (LED).

For example, the basic structure of an organic EL element is a structure in which a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. Since the response speed of the organic EL element is high, a display apparatus suitable for displaying a fast-moving image can be achieved. For example, Patent Document 1 discloses a display apparatus with a large number of pixels and a high resolution, which includes a light-emitting device including organic EL.

REFERENCE

Patent Document

[Patent Document 1] PCT International Publication No. 2019/220278

SUMMARY OF THE INVENTION

Problems to be Solved by the Invention

A driving method called black insertion driving is known as a driving method that improves the display quality of a display apparatus. The black insertion driving means that black display is performed in every other frame or black display is performed for a certain period in one frame. Performing the black insertion driving can reduce an after-image, an image blur, and the like in displaying a moving image to improve the sharpness of the moving image. For example, in the case where black display is performed for a certain period in one frame, it is preferable that black display be performed in the whole display portion simultaneously (which is sometimes referred to as global black insertion) because the display quality in displaying a moving image can be further increased as compared with the case of performing black display row by row sequentially. In addition, the global black insertion can be suitably used as a method for driving a display apparatus provided in a VR device or the like having an eye tracking function, for example. Performing the global black insertion makes it possible to conduct gaze sensing required for eye tracking in a black insertion period; therefore, it is not necessary to provide another period for gaze sensing.

An object of one embodiment of the present invention is to provide a display apparatus having higher definition and capable of global black insertion or a method for driving the display apparatus. Another object of one embodiment of the present invention is to provide a display apparatus having increased operation speed and capable of global black insertion or a method for driving the display apparatus. Another object of one embodiment of the present invention is to provide a display apparatus having higher display quality and a method for driving the display apparatus. Another object of one embodiment of the present invention is to provide a novel display apparatus or a novel method for driving the display apparatus.

Means for Solving the Problems (1)

One embodiment of the present invention is a method for driving a display apparatus including a first layer and a second layer over the first layer. The first layer includes a plurality of driver circuit regions. The second layer includes a plurality of display regions. Each of the plurality of driver circuit regions includes a driver circuit. Each of the plurality of display regions includes a plurality of pixels. Each of the plurality of pixels includes a light-emitting element. The driver circuit included in one of the plurality of driver circuit regions has a function of driving each of the plurality of pixels included in one of the plurality of display regions. The method for driving the display apparatus includes: performing a first operation in which an operation of sequentially writing an image signal row by row in each of the plurality of display regions is performed and the operation is performed in all the plurality of display regions at the same time; performing a second operation in which the light-emitting elements included in the plurality of pixels are brought into a light-emitting state simultaneously after the first operation; and performing a third operation in which the light-emitting elements included in the plurality of pixels are brought into a non-light-emitting state simultaneously after the second operation.

(2)

In the method for driving the display apparatus described in (1) above, the second layer may include a transistor including a metal oxide in a semiconductor layer where a channel is formed.

(3)

In the method for driving the display apparatus described in (1) or (2) above, the first layer may include a transistor including silicon in a semiconductor layer where a channel is formed (4)

In the method for driving the display apparatus described in any one of (1) to (3) above, the light-emitting element may be an organic EL element.

(5)

In the method for driving the display apparatus described in any one of (1) to (3) above, the light-emitting element may be a light-emitting diode.

(6)

One embodiment of the present invention is a display apparatus including a first layer and a second layer over the first layer. The first layer includes a plurality of driver circuit regions. The second layer includes a plurality of display regions. Each of the plurality of driver circuit regions includes a driver circuit. Each of the plurality of display regions includes a plurality of pixels. Each of the plurality of pixels includes a light-emitting element. The driver circuit included in one of the plurality of driver circuit regions has a function of driving each of the plurality of pixels included in one of the plurality of display regions. The display apparatus has a function of performing a first operation in which an operation of sequentially writing an image signal row by row in each of the plurality of display regions is performed and the operation is performed in all the plurality of display regions at the same time; a function of performing a second operation in which the light-emitting elements included in the plurality of pixels are brought into a light-emitting state simultaneously after the first operation; and a function of performing a third operation in which the light-emitting elements included in the plurality of pixels are brought into a non-light-emitting state simultaneously after the second operation.

(7)

In the display apparatus described in (6) above, the second layer may include a transistor including a metal oxide in a semiconductor layer where a channel is formed.

(8)

In the display apparatus described in (6) or (7) above, the first layer may include a transistor including silicon in a semiconductor layer where a channel is formed.

(9)

In the display apparatus described in any one of (6) to (8) above, the light-emitting element may be an organic EL element.

(10)

In the display apparatus described in any one of (6) to (8) above, the light-emitting element may be a light-emitting diode.

Effect of the Invention

One embodiment of the present invention can provide a display apparatus having higher definition and capable of global black insertion or a method for driving the display apparatus. Another embodiment of the present invention can provide a display apparatus having increased operation speed and capable of global black insertion or a method for driving the display apparatus. Another embodiment of the present invention can provide a display apparatus having higher display quality and a method for driving the display apparatus. Another embodiment of the present invention can provide a novel display apparatus or a novel method for driving the display apparatus.

MODE FOR CARRYING OUT THE INVENTION

Figure 1A:
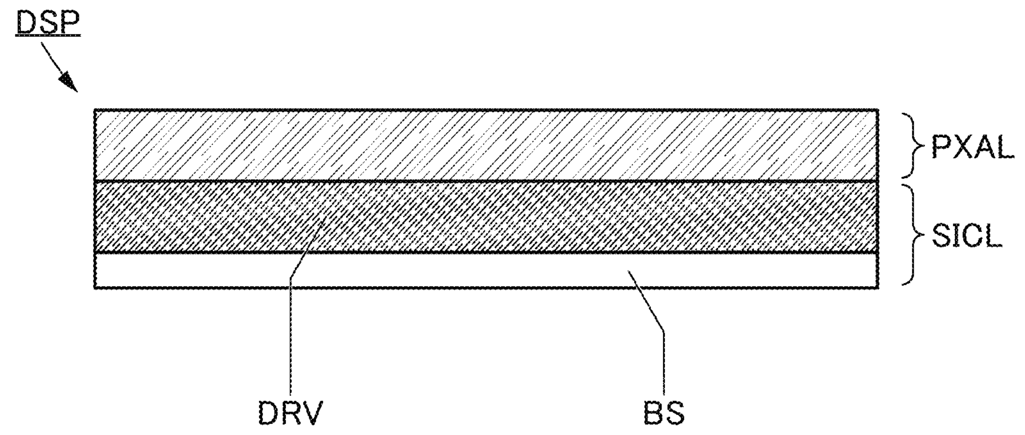
FIG. 1A and FIG. 1B are schematic cross-sectional views illustrating structure examples of a display apparatus.

In this specification and the like, a semiconductor device refers to a device that utilizes semiconductor characteristics, and means a circuit including a semiconductor element (e.g., a transistor, a diode, or a photodiode) or a device including the circuit, for example. The semiconductor device also means all devices that can function by utilizing semiconductor characteristics. For example, an integrated circuit, a chip including an integrated circuit, and an electronic component including a chip in a package are examples of the semiconductor device. Moreover, for example, a memory device, a display apparatus, a light-emitting apparatus, a lighting device, an electronic device, and the like themselves may be semiconductor devices and may each include a semiconductor device.

In the case where there is description “X and Y are connected” in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit (e.g., a step-up circuit and a step-down circuit) or a level shifter circuit for changing the potential level of a signal); a voltage source; a current source; a switch circuit; an amplifier circuit (e.g., a circuit that can increase signal amplitude, the current amount, or the like, an operational amplifier, a differential amplifier circuit, a source follower circuit, or a buffer circuit); a signal generation circuit; a memory circuit; or a control circuit) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed that "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed that "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In this specification and the like, as a "resistor", a circuit element, a wiring, or the like having a resistance value higher than 0Ω can be used, for example. Accordingly, in this specification and the like, examples of the "resistor" include a wiring having a resistance value, a transistor in which current flows between its source and drain, a diode, and a coil. Thus, the term "resistor" can be replaced with the terms "resistance", "load", "region having a resistance value", or the like. Conversely, the terms "resistance", "load", and "region having a resistance value" can be replaced with the term "resistor", or the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^{9}$Ω.

In the case where a wiring is used as a resistor, the resistance value of the resistor is sometimes determined depending on the length of the wiring. Alternatively, a conductor with resistivity different from that of a conductor used as a wiring is sometimes used as a resistor. Alternatively, in the case where a semiconductor is used as a resistor, the resistance value of the resistor is sometimes determined by doping a semiconductor with an impurity.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Thus, in this specification and the like, a "capacitor" is not limited to only a circuit element that has a pair of electrodes and a dielectric between the electrodes. A "capacitor" includes, for example, parasitic capacitance generated between wirings, gate capacitance generated between a gate and one of a source and a drain of a transistor, and the like. The term "capacitor", "parasitic capacitance", "gate capacitance", or the like can be replaced with the term "capacitance" and the like, for example. Conversely, the term "capacitance" can be replaced with the term "capacitor", "parasitic capacitance", "gate capacitance", or the like, for example. The term "a pair of electrodes" of a "capacitor" can be replaced with "a pair of conductors", "a pair of conductive regions", "a pair of regions", or the like, for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, each of the gates may be referred to as a first gate, a second gate, or a third gate, for example, in this specification and the like.

In this specification and the like, a "node" can be referred to as a "terminal", a "wiring", an "electrode", a "conductive layer", a "conductor", an "impurity region", or the like depending on the circuit structure, the device structure, or the like, for example. Furthermore, a "terminal", a "wiring", or the like can be referred to as a "node", for example.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Note that a potential is relative. Moreover, potentials are relative values. That is, a potential supplied to a wiring, a potential applied to a circuit and the like, or a potential output from a circuit and the like, are changed with a change of the reference potential.

In this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

In this specification and the like, "current" means a charge transfer (electrical conduction). For example, the description "electrical conduction of positively charged particles occurs" can be rephrased as "electrical conduction of negatively charged particles occurs in the opposite direction". Thus, unless otherwise specified, "current" in this specification and the like refers to a charge transfer phenomenon (electrical conduction) accompanied by carrier movement. Examples of a carrier here include an electron, a hole, an anion, a cation, and a complex ion. The type of carrier differs depending on current-flowing systems (e.g., a semiconductor, a metal, an electrolyte solution, or a vacuum). For example, the "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A" and the like, for example. The description "current is input to element A" and the like can be rephrased as "current is output from element A" and the like, for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the SCOPE OF CLAIMS, or the like. Furthermore, for example, a "first" component in one embodiment in this specification and the like can be omitted in other embodiments, the SCOPE OF CLAIMS, or the like.

In this specification and the like, for example, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the terms for describing arrangement in this specification and the like are not limited to those and can be replaced with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°. Moreover, the expression "an insulator located over (on) a top surface of a conductor" can be replaced with the expression "an insulator located on a left surface (or a right surface) of a conductor" when the direction of a drawing showing these components is rotated by 90°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where the electrode B is formed over the insulating layer A. The expression "electrode B overlapping with insulating layer A", for example, does not exclude the state where the electrode B is formed under the insulating layer A and the state where the electrode B is formed on the right side (or the left side) of the insulating layer A.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the term "film", "layer", or the like can be, for example, interchanged with each other depending on the situation, in some cases. For example, the term "conductive layer" can be changed into the term "conductive film" in some cases. For another example, the term "insulating film" can be changed into the term "insulating layer" in some cases. Alternatively, for example, the term "film", "layer", or the like is not used and can be interchanged with another term depending on the situation, in some cases. For example, the term "conductive layer" or "conductive film" can be changed into the term "conductor" in some cases. Furthermore, the term "conductor" can be changed into the term "conductive layer" or "conductive film" in some cases. For example, the term "insulating layer" or "insulating film" can be changed into the term "insulator" in some cases. Furthermore, the term "insulator" can be changed into the term "insulating layer" or "insulating film" in some cases.

In addition, in this specification and the like, for example, the term such as "electrode", "wiring", or "terminal" does not limit the function of a component. For example, an "electrode" is used as part of a wiring in some cases, and vice versa. Furthermore, the term "electrode" or "wiring" also includes, for example, the case where a plurality of "electrodes" or "wirings" are formed in an integrated manner. For example, a "terminal" is used as part of a "wiring", an "electrode", or the like in some cases, and vice versa. Furthermore, the term "terminal" also includes the case where a plurality of "electrodes", "wirings", "terminals", or the like are formed in an integrated manner, for example. Thus, for example, an "electrode" can be part of a "wiring" or a "terminal". Furthermore, a "terminal" can be part of a "wiring" or an "electrode". Moreover, the term "electrode", "wiring", "terminal", or the like is sometimes replaced with the term "region", for example.

In addition, in this specification and the like, for example, the terms such as "wiring", "signal line", and "power supply line" can be interchanged with each other depending on the situation, in some cases. For example, the term "wiring" can be changed into the term "signal line" in some cases. For another example, the term "wiring" can be changed into the term "power supply line" or the like in some cases. Conversely, for example, the term "signal line", "power supply line", or the like can be changed into the term "wiring" in some cases. Furthermore, for example, the term "power supply line" or the like can be changed into the term "signal line" or the like in some cases. Conversely, for example, the term "signal line" or the like can be changed into the term "power supply line" or the like in some cases. Moreover, the term "potential" that is applied to a wiring can be changed into the term "signal" or the like depending on the situation, for example. Conversely, for example, the term "signal" or the like can be changed into the term "potential" in some cases.

In this specification and the like, a "switch" includes a plurality of terminals and has a function of switching (selecting) electrical continuity and discontinuity between the terminals. For example, in the case where a switch includes two terminals and electrical continuity is established between the two terminals, the switch is in a "conduction state" or an "on state". In the case where electrical continuity is not established between the two terminals, the switch is in a "non-conduction state" or an "off state". Note that switching to one of a conduction state and a non-conduction state or maintaining one of a conduction state and a non-conduction state is sometimes referred to as "controlling a conduction state".

That is, a switch has a function of controlling whether current flows therethrough or not. Alternatively, a switch has a function of selecting and changing a current path. For example, an electrical switch or a mechanical switch can be used as the switch. That is, a switch can be any element capable of controlling current, and is not limited to a particular element.

Note that as a kind of a switch, there is a switch which is normally in a non-conduction state and brought into a conduction state by controlling a conduction state; such a switch is referred to as an "A contact" in some cases. Furthermore, as another kind of a switch, there is a switch which is normally in a conduction state and brought into a non-conduction state by controlling a conduction state; such a switch is referred to as a "B contact" in some cases.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" or "on state" of the transistor refers to a state where a source electrode and a drain electrode of the transistor can be regarded as being electrically short-circuited. Furthermore, a "non-conduction state" or "off state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction state with the movement of the electrode.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, for example, the terms "identical", "the same", "equal", "uniform", and the like (including synonyms of these words) used in describing calculation values and measurement values or in describing objects, methods, events, and the like that can be converted into calculation values or measurement values, allow for a margin of error of ±20% unless otherwise specified.

In this specification and the like, an impurity in a semiconductor refers to, for example, an element other than a main component of a semiconductor layer. For example, an element with a concentration of lower than 0.1 atomic % is an impurity. When an impurity is contained in a semiconductor, for example, the density of defect states in a semiconductor is increased, carrier mobility is decreased, or crystallinity is decreased in some cases. In the case where the semiconductor is an oxide semiconductor, examples of an impurity that changes the characteristics of the semiconductor include Group 1 elements, Group 2 elements, Group 13 elements, Group 14 elements, Group 15 elements, or transition metals other than the main components of the oxide semiconductor. Specific examples include hydrogen (included also in water), lithium, sodium, silicon, boron, phosphorus, carbon, and nitrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like, for example. For example, in the case where a metal oxide is used in a semiconductor layer of a transistor, the metal oxide is referred to as an oxide semiconductor in some cases. That is, when a metal oxide is used as a material that can be used for a channel formation region of a transistor that has at least one of an amplifying function, a rectifying function, and a switching function, the metal oxide can be referred to as a metal oxide semiconductor. In addition, the term "OS transistor" can also be referred to as a transistor containing a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined with each other as appropriate.

Embodiments described in this specification are described with reference to the drawings. Note that the embodiments can be implemented in many different modes. Thus, it will be readily understood by those skilled in the art that the modes and details can be changed in various ways without departing from the spirit and scope thereof. Thus, the present invention should not be interpreted as being limited to the description in the embodiments. As for the drawings illustrating the embodiments, in the structures of the invention, the same reference numerals are used in common for the same portions or portions having similar functions in different drawings, and repeated description thereof is omitted in some cases. Furthermore, the same hatch pattern is used for the portions having similar functions throughout the drawings, and the portions are not especially denoted by reference numerals in some cases. Moreover, some components are omitted in a perspective view, a top view, and the like for easy understanding of the drawings in some cases. In the drawings, for example, a hatching pattern or the like is omitted in some cases.

In addition, in the drawings and the like in this specification, the size, the layer thickness, or the region is exaggerated for clarity in some cases. Thus, the drawings are not necessarily limited to the drawings with the illustrated size, aspect ratio, and the like, for example. Note that the drawings schematically illustrate ideal examples, and embodiments of the present invention are not limited to shapes, values, and the like illustrated in the drawings, for example. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals, for example. For example, a plurality of light-emitting elements 61 are sometimes shown individually as a light-emitting element 61R, a light-emitting element 61G, and a light-emitting element 61B. In other words, in the cases where matters that apply to the light-emitting element 61R, the light-emitting element 61G, and the light-emitting element 61B are described and they do not need to be differentiated from each other, the light-emitting elements may be simply referred to as the light-emitting element 61.

Embodiment 1

In this embodiment, a structure example of a display apparatus of one embodiment of the present invention and an example of a method for driving the display apparatus will be described.

<Structure Example of Display Apparatus>

FIG. 1A is a schematic cross-sectional view of the display apparatus of one embodiment of the present invention. A display apparatus DSP illustrated in FIG. 1A includes a pixel layer PXAL and a circuit layer SICL as an example.

The pixel layer PXAL is provided over the circuit layer SICL. Note that the pixel layer PXAL overlaps with a region including a driver circuit region DRV described later.

The circuit layer SICL includes a substrate BS and the driver circuit region DRV.

As the substrate BS, an insulating substrate or a semiconductor substrate containing a variety of materials can be used. For example, a substrate containing silicon can be used as the substrate BS.

The driver circuit region DRV is provided over the substrate BS.

The driver circuit region DRV includes, for example, a driver circuit for driving a pixel included in the pixel layer PXAL to be described later. Note that a specific structure example of the driver circuit region DRV will be described later.

The pixel layer PXAL includes, for example, a plurality of pixels. The plurality of pixels may be arranged in a matrix in the pixel layer PXAL.

Each of the plurality of pixels can express one color or a plurality of colors. In particular, the plurality of colors can be, for example, three colors of red (R), green (G), and blue (B). Alternatively, the plurality of colors may be at least one of, for example, red (R), green (G), blue (B), cyan (C), magenta (M), yellow (Y), and white (W). Note that in the case where each of pixels expressing different colors is called a subpixel and white is expressed by a plurality of subpixels emitting light of different colors, the plurality of subpixels are collectively called a pixel in some cases. In this specification and the like, a subpixel is referred to as a pixel for convenience in some cases.

Figure 2A:
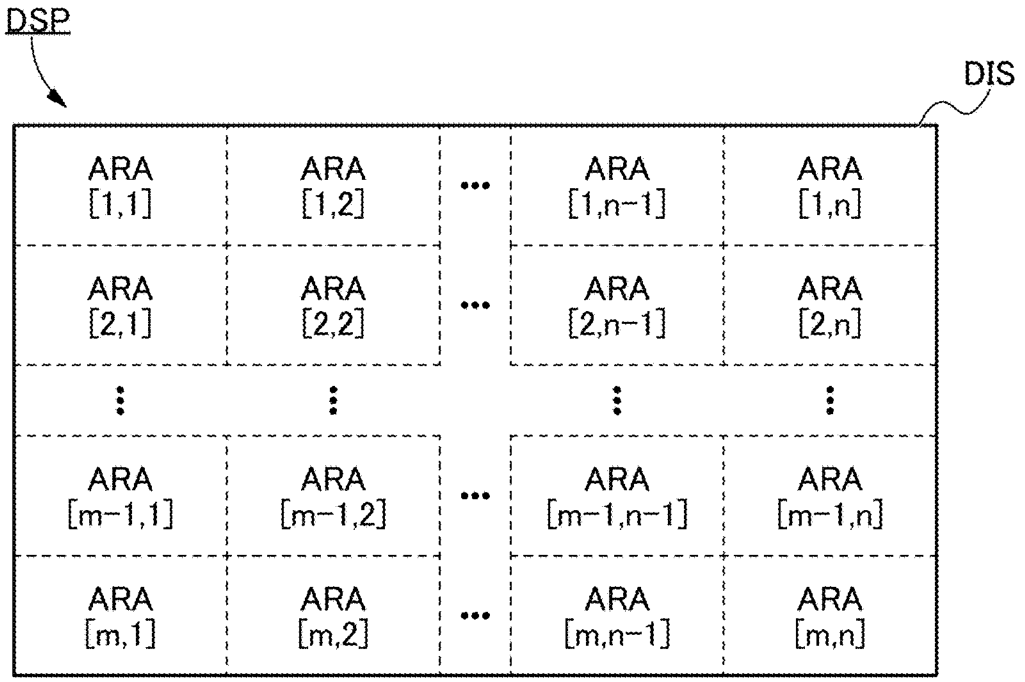
FIG. 2A is a schematic plan view illustrating an example of a display portion of a display apparatus.

FIG. 2A is an example of a plan view of the display apparatus DSP and illustrates only a display portion DIS. Note that the display portion DIS can be a plan view of the pixel layer PXAL.

In the display apparatus DSP in FIG. 2A, the display portion DIS is divided into regions in m rows and n columns (m is an integer greater than or equal to 2, and n is an integer greater than or equal to 1) as an example. Thus, the display portion DIS includes a display region ARA[1,1] to a display region ARA[m,n]. Note that FIG. 2A selectively illustrates the display region ARA[1,1], the display region ARA[2,1], the display region ARA[m−1,1], the display region ARA[m, 1], the display region ARA[1,2], the display region ARA[2, 2], the display region ARA[m−1,2], the display region ARA[m,2], the display region ARA[1,n−1], the display region ARA[2,n−1], the display region ARA[m−1,n−1], the display region ARA[m,n−1], the display region ARA[1,n], the display region ARA[2,n], the display region ARA[m−1, n], and the display region ARA[m,n], as an example.

For example, in the case where the display portion DIS is divided into 32 regions, m=4 and n=8 in FIG. 2A. In the case where the display apparatus DSP has a definition of 8K4K, the number of pixels is 7680×4320. In the case where the colors of subpixels of the display portion DIS are three colors, red (R), green (G), and blue (B), the total number of subpixels is 7680×4320×3. Here, in the case where a pixel array of the display portion DIS with a definition of 8K4K is divided into 32 regions, the number of pixels per region is 960×1080, and when the colors of the subpixels of the display apparatus DSP are three colors, red (R), green (G), and blue (B), the number of subpixels per region is 960×1080×3.

Here, the driver circuit region DRV included in the circuit layer SICL of the case where the display portion DIS of the display apparatus DSP in FIG. 2A is divided into regions in m rows and n columns is considered.

Figure 2B:
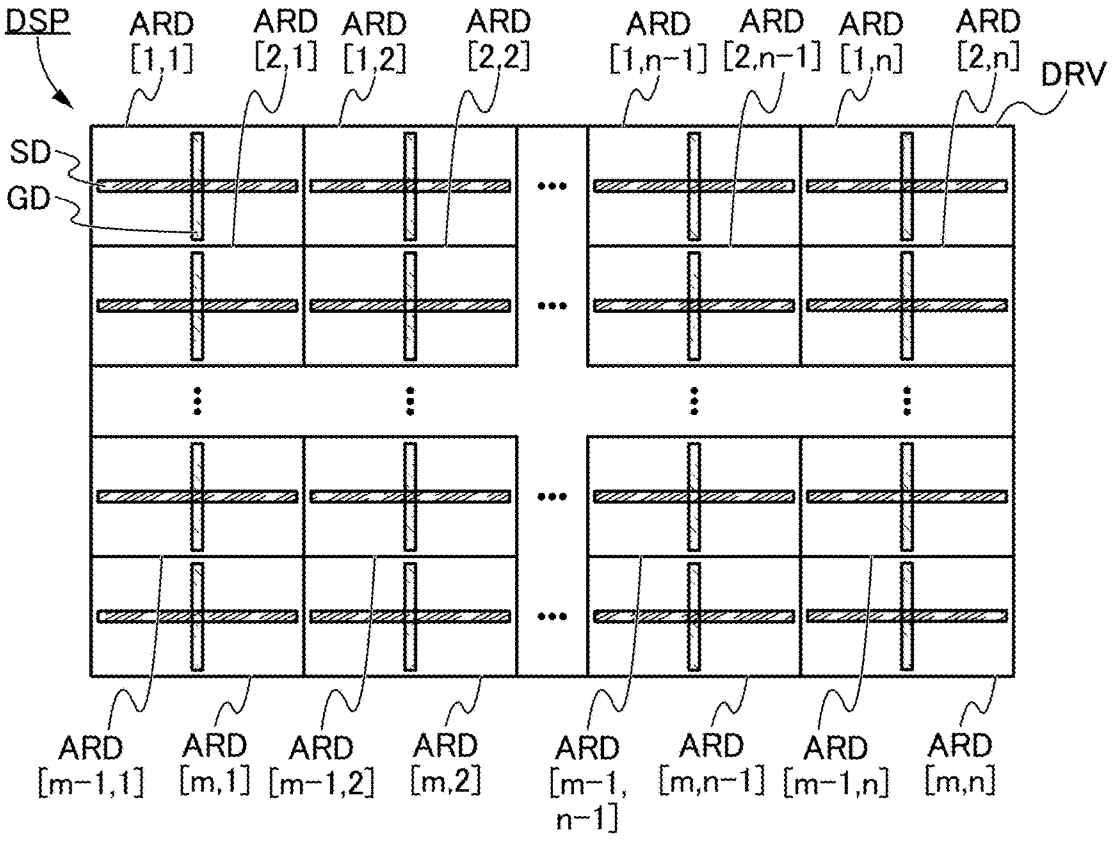
FIG. 2B is a schematic plan view illustrating an example of a driver circuit region of the display apparatus.

FIG. 2B is an example of a plan view of the display apparatus DSP, illustrating only the driver circuit region DRV included in the circuit layer SICL.

Since the display portion DIS of the display apparatus DSP in FIG. 2A is divided into regions of m rows and n columns, each of the display region ARA[1,1] to the display region ARA[m,n] which are divided from each other needs a corresponding driver circuit. Specifically, the driver circuit region DRV may also be divided into regions of m rows and n columns and a driver circuit may be provided in each of the divided regions.

The driver circuit region DRV in the display apparatus DSP in FIG. 2B includes regions divided into m rows and n columns. Thus, the driver circuit region DRV includes a circuit region ARD[1,1] to a circuit region ARD[m,n]. Note that FIG. 2B selectively illustrates the circuit region ARD [1,1], the circuit region ARD[2,1], the circuit region ARD [m−1,1], the circuit region ARD[m,1], the circuit region ARD[1,2], the circuit region ARD[2,2], the circuit region ARD[m−1,2], the circuit region ARD[m,2], the circuit region ARD[1,n−1], the circuit region ARD[2,n−1], the circuit region ARD[m−1,n−1], the circuit region ARD[m,n−1], the circuit region ARD[1,n], the circuit region ARD[2,n], the circuit region ARD[m−1,n], and the circuit region ARD [m,n], as an example.

Each of the circuit region ARD[1,1] to the circuit region ARD[m,n] includes a driver circuit SD and a driver circuit GD. For example, the driver circuit SD and the driver circuit GD included in the circuit region ARD[i,j] (not illustrated in FIG. 2B) positioned in the i-th row and the j-th column (i is an integer greater than or equal to 1 and less than or equal to m, and j is an integer greater than or equal to 1 and less than or equal to n) can drive a plurality of pixels included in the display region ARA[i,j] positioned in the i-th row and the j-th column in the display portion DIS.

The driver circuit SD functions as, for example, a source driver circuit that transmits image signals to a plurality of pixels included in the corresponding circuit region ARD. The driver circuit SD can be formed with at least one of a variety of circuits such as a shift register, an inverter, a latch, a level shifter, a buffer, an analog switch, an operational amplifier, and a D/A converter, for example.

The driver circuit GD functions as, for example, a gate driver circuit that selects a plurality of pixels that are destinations to which image signals are transmitted, in the corresponding circuit region ARD. The driver circuit GD can be formed with at least one of a variety of circuits such as a shift register, an inverter, a latch, a level shifter, and a buffer, for example.

In FIG. 2A and FIG. 2B, the display region ARA[i,j] (not illustrated in FIG. 2A and FIG. 2B) and the circuit region ARD[i,j] are positioned in a region where they overlap with each other in the plan view. When the display region ARA[i,j] and the circuit region ARD[i,j] overlap with each other, a wiring electrically connecting the display region ARA[i,j] and the circuit region ARD[i,j] can be shortened, so that the parasitic resistance of the wiring can be reduced. Furthermore, shortening the wiring can reduce parasitic capacitance of the wiring, and thus the time constant of the wiring can be decreased. When the time constant of the wiring is decreased, the time for writing an image to be displayed on the display region ARA[i,j] can be shortened, and the frame frequency can be consequently increased.

Figure 3:
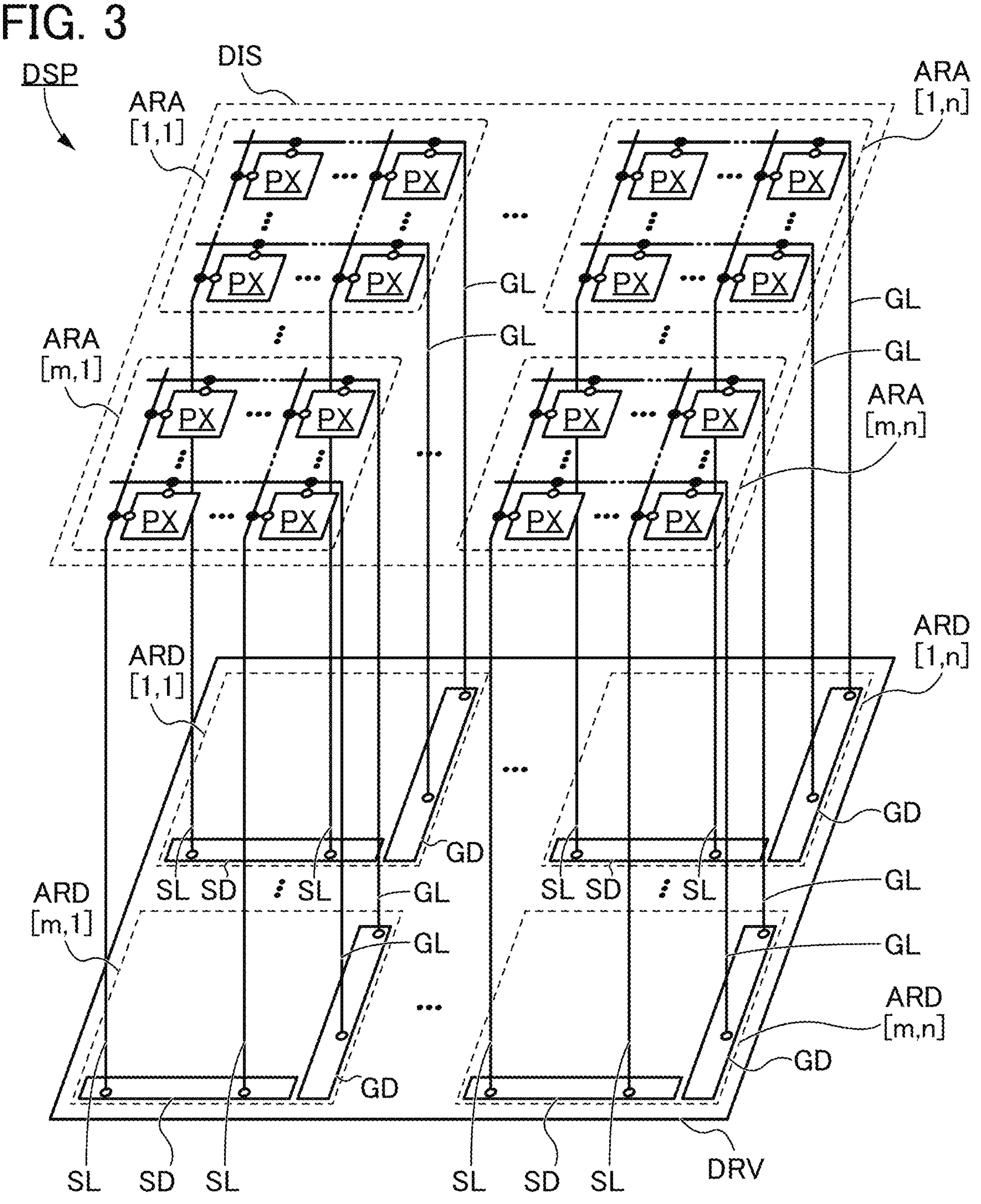
FIG. 3 is a perspective view illustrating a structure example of a display apparatus.

FIG. 3 is a perspective view of the display apparatus DSP illustrated in FIG. 2A and FIG. 2B. FIG. 3 selectively illustrates the display region ARA[1,1], the display region ARA[m, 1], the display region ARA[1,n], and the display region ARA[m,n] as the display regions ARA, and selectively illustrates the circuit region ARD[1,1], the circuit region ARD[m,1], the circuit region ARD[1,n], and the circuit region ARD[m,n] as the circuit regions ARD.

In the display apparatus DSP in FIG. 3, each of the plurality of display regions ARA includes a plurality of pixels PX, for example. In the display region ARA, the plurality of pixels PX are arranged in a matrix.

In each of the plurality of display regions ARA, a plurality of wirings GL are extended in the row direction and a plurality of wirings SL are extended in the column direction. Each of the plurality of pixels PX arranged in a matrix in the display region ARA is electrically connected to the wiring GL in the corresponding row. Similarly, each of the plurality of pixels PX is electrically connected to the wiring SL in the corresponding column.

Although FIG. 3 illustrates an example where one pixel PX is connected to one wiring GL and one wiring SL, one embodiment of the present invention is not limited thereto.

One pixel PX may be connected to two or more wirings GL and two or more wirings SL depending on the structure of the pixel PX.

In the display apparatus DSP in FIG. 3, each of the plurality of circuit regions ARD includes the driver circuit SD and the driver circuit GD as illustrated in the display apparatus DSP in FIG. 2B.

As described with reference to FIG. 2A and FIG. 2B, the driver circuit SD and the driver circuit GD included in the circuit region ARD[i,j] have a function of driving the plurality of pixels included in the display region ARA[i,j]. Thus, the driver circuit SD included in the circuit region ARD[i,j] is electrically connected to the plurality of wirings SL extending in the display region ARA[i,j]. The driver circuit GD included in the circuit region ARD[i,j] is electrically connected to the plurality of wirings GL extending in the display region ARA[i,j].

In order to electrically connect the display region ARA [i,j] and the circuit region ARD[i,j], the plurality of wirings SL and the plurality of wirings GL are provided between the display portion DIS and the driver circuit region DRV.

The display region ARA[i,j] and the circuit region ARD [i,j] are arranged so as to overlap with each other, whereby the wiring electrically connecting the display region ARA [i,j] and the circuit region ARD[i,j] to each other can be extended in the direction perpendicular or substantially perpendicular to the substrate BS, for example. When the wiring is extended in the perpendicular direction or substantially perpendicular direction, the length of the wiring can be shortened; thus, the parasitic resistance of the wiring can be reduced as described above. In addition, the parasitic capacitance of the wiring can be reduced. Accordingly, a voltage for supplying current to the wiring can be reduced, leading to reduced power consumption.

Note that the display apparatus DSP illustrated in FIG. 1A, FIG. 2A, FIG. 2B, and FIG. 3 has a structure in which the display region ARA[i,j] and the circuit region ARD[i,j] overlap with each other in the display portion DIS; however, the display apparatus of one embodiment of the present invention is not limited to the structure. In a structure of the display apparatus of one embodiment of the present invention, the display region ARA[i,j] and the circuit region ARD[i,j] do not necessarily overlap with each other.

Figure 1B:
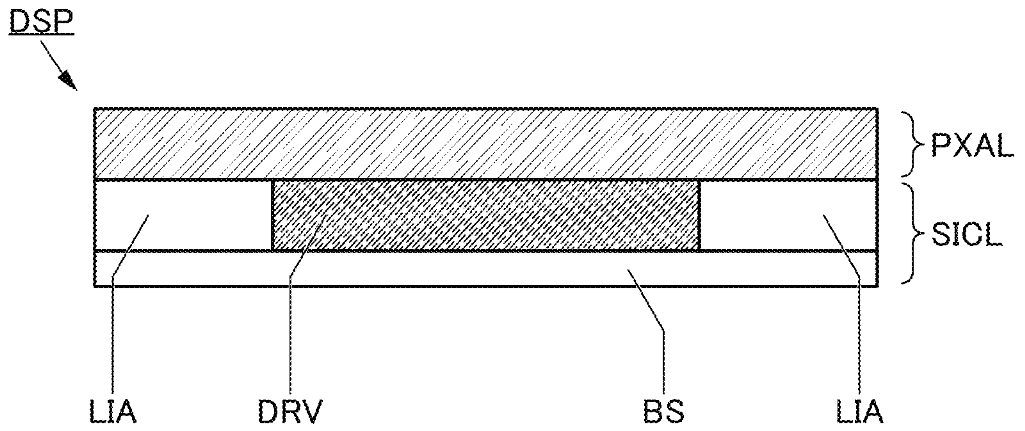

For example, as illustrated in FIG. 1B, the display apparatus DSP may have a structure in which not only the driver circuit region DRV but also a region LIA is provided over the substrate BS.

A wiring is provided in the region LIA, as an example. At this time, the display apparatus DSP may have a structure in which a circuit included in the driver circuit region DRV and a circuit included in the pixel layer PXAL are electrically connected to each other through the wiring included in the region LIA.

Figure 4:
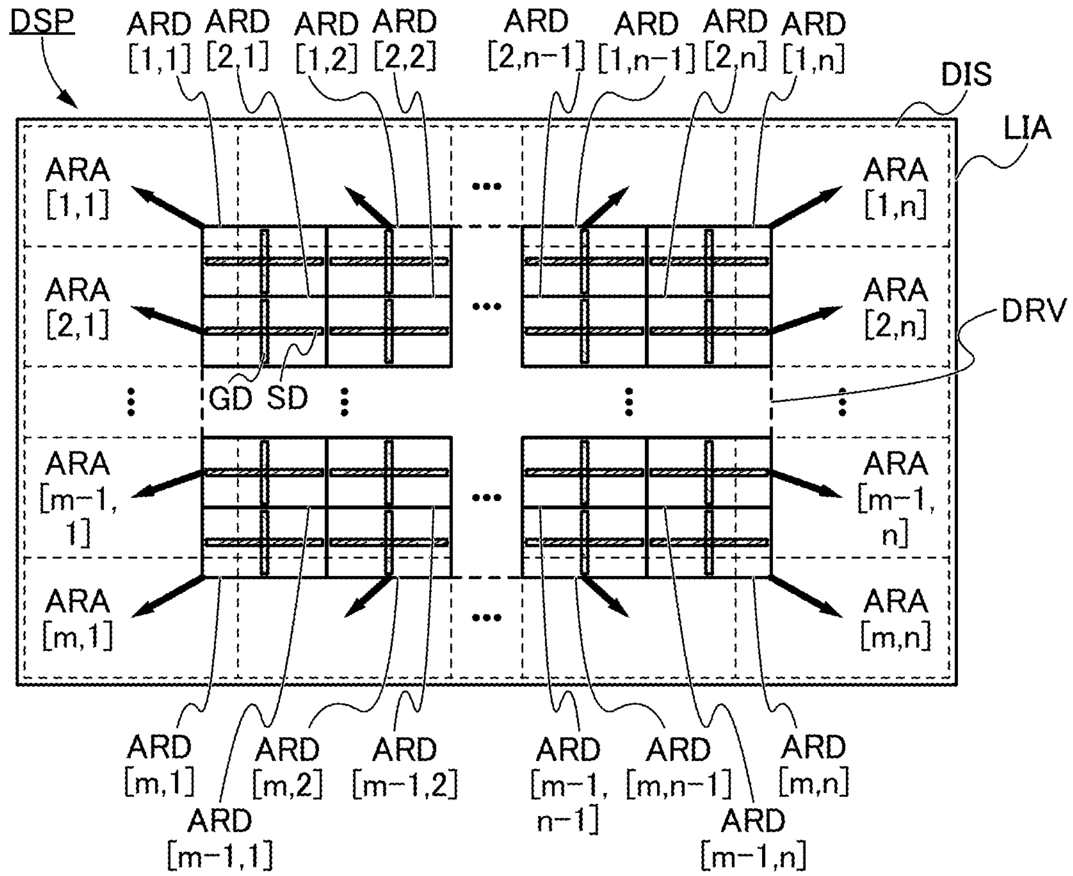
FIG. 4 is a schematic plan view illustrating a structure example of a display apparatus.

FIG. 4 is an example of a plan view of the display apparatus DSP illustrated in FIG. 1B and illustrates only the circuit layer SICL. The display apparatus DSP in FIG. 4 has a structure in which the driver circuit region DRV is surrounded by the region LIA, as an example. Thus, as illustrated in FIG. 4, the driver circuit region DRV is provided to overlap with the inside of the display portion DIS in the plan view.

In the display apparatus DSP illustrated in FIG. 4, the display portion DIS is divided into the display region ARA[1,1] to the display region ARA[m,n] and the driver circuit region DRV is also divided into the circuit region ARD[1,1] to the circuit region ARD[m,n] as in FIG. 2A.

As illustrated in FIG. 4, a correspondence between the display region ARA and the circuit region ARD including the driver circuit that drives pixels included in the display region ARA is shown by a thick arrow. Specifically, the driver circuit included in the circuit region ARD[1,1] drives pixels included in the display region ARA[1,1], and the driver circuit included in the circuit region ARD[2,1] drives pixels included in the display region ARA[2,1]. The driver circuit included in the circuit region ARD[m−1,1] drives pixels included in the display region ARA[m−1,1], and the driver circuit included in the circuit region ARD[m, 1] drives pixels included in the display region ARA[m,1]. The driver circuit included in the circuit region ARD[1,n] drives pixels included in the display region ARA[1,n], and the driver circuit included in the circuit region ARD[2,n] drives pixels included in the display region ARA[2,n]. The driver circuit included in the circuit region ARD[m−1,n] drives pixels included in the display region ARA[m−1,n], and the driver circuit included in the circuit region ARD[m,n] drives pixels included in the display region ARA[m,n]. That is, although not illustrated in FIG. 4, the driver circuit included in the circuit region ARD[i,j] positioned in the i-th row and the j-th column drives pixels included in the display region ARA[i, j].

In FIG. 1B and FIG. 4, when the driver circuit included in the circuit region ARD in the circuit layer SICL and the pixel included in the display region ARA in the pixel layer PXAL are electrically connected through a wiring, the display apparatus DSP can have a structure in which the display region ARA[i,j] and the circuit region ARD[i,j] do not necessarily overlap with each other. Accordingly, the positional relation between the driver circuit region DRV and the display portion DIS is not limited to the plan view of the display apparatus DSP in FIG. 4, and the position of the driver circuit region DRV can be freely determined.

Note that in FIG. 2B and FIG. 4, the driver circuit SD and the driver circuit GD are arranged so as to form a cross in each of the circuit region ARD[1,1] to the circuit region ARD[m,n]; however, the arrangement of the driver circuit SD and the driver circuit GD is not limited to the structure of the display apparatus of one embodiment of the present invention. For example, the arrangement of the driver circuit SD and the driver circuit GD may form an L shape in one circuit region ARD in the driver circuit region DRV as illustrated in FIG. 3. Alternatively, one of the driver circuit SD and the driver circuit GD may be placed in upper and lower parts in a plan view and the other of the driver circuit SD and the driver circuit GD may be placed in right and left parts in the plan view.

As illustrated in FIG. 2A to FIG. 4, the display portion DIS of the display apparatus DSP is divided into the display region ARA[1,1] to the display region ARA[m,n], and the driver circuit SD and the driver circuit GD are provided in the circuit region ARD corresponding to each display region ARA, whereby each of the display region ARA[1,1] to the display region ARA[m,n] can be independently driven.

For example, for the display region ARA with a high rewriting frequency of image data, the driver circuit SD and the driver circuit GD provided in the corresponding circuit region ARD can be driven with a high frame frequency; and for the display region ARA with a low rewriting frequency of image data, the driver circuit SD and the driver circuit GD provided in the corresponding circuit region ARD can be driven with a low frame frequency. For example, in the case of a moving image with a high rewriting frequency of image data, the driver circuit SD and the driver circuit GD corresponding to the display region ARA may be driven with a high frame frequency higher than or equal to 60 Hz, higher than or equal to 120 Hz, higher than or equal to 144 Hz, higher than or equal to 165 Hz, higher than or equal to 180 Hz, or higher than or equal to 240 Hz. For example, in the case of a still image with a low rewriting of image data, the driver circuit SD and the driver circuit GD corresponding to the display region ARA may be driven with a low frame frequency of lower than or equal to 5 Hz, lower than or equal to 1 Hz, lower than or equal to 0.5 Hz, or lower than or equal to 0.1 Hz. In this manner, the display portion DIS of the display apparatus DSP is divided into the display region ARA[1,1] to the display region ARA[m,n], whereby the rewrite frequency (frame frequency) can be changed depending on an image displayed on the display region ARA. That is, in the display portion DIS of the display apparatus DSP, at least two of the display region ARA[1,1] to the display region ARA[m,n] can display images with different frame frequencies.

For example, the driver circuits SD and the driver circuits GD provided in the circuit region ARD[1,1] to the circuit region ARD[m,n] may be driven at the same time, whereby the corresponding display region ARA[1,1] to the corresponding display region ARA[m,n] may be driven at the same time. In a method for driving the display apparatus of one embodiment of the present invention, the operation speed of the display apparatus DSP is increased by driving the display region ARA[1,1] to the display region ARA[m,n] at the same time.

<Example of Method for Driving Display Apparatus>

The method for driving the display apparatus of one embodiment of the present invention will be described. The method for driving the display apparatus of one embodiment of the present invention can be suitably used for the above-described display apparatus DSP. Here, as an example, a method for driving a display apparatus in which a display portion is divided into display regions of four rows and one column is described.

Figure 5A:
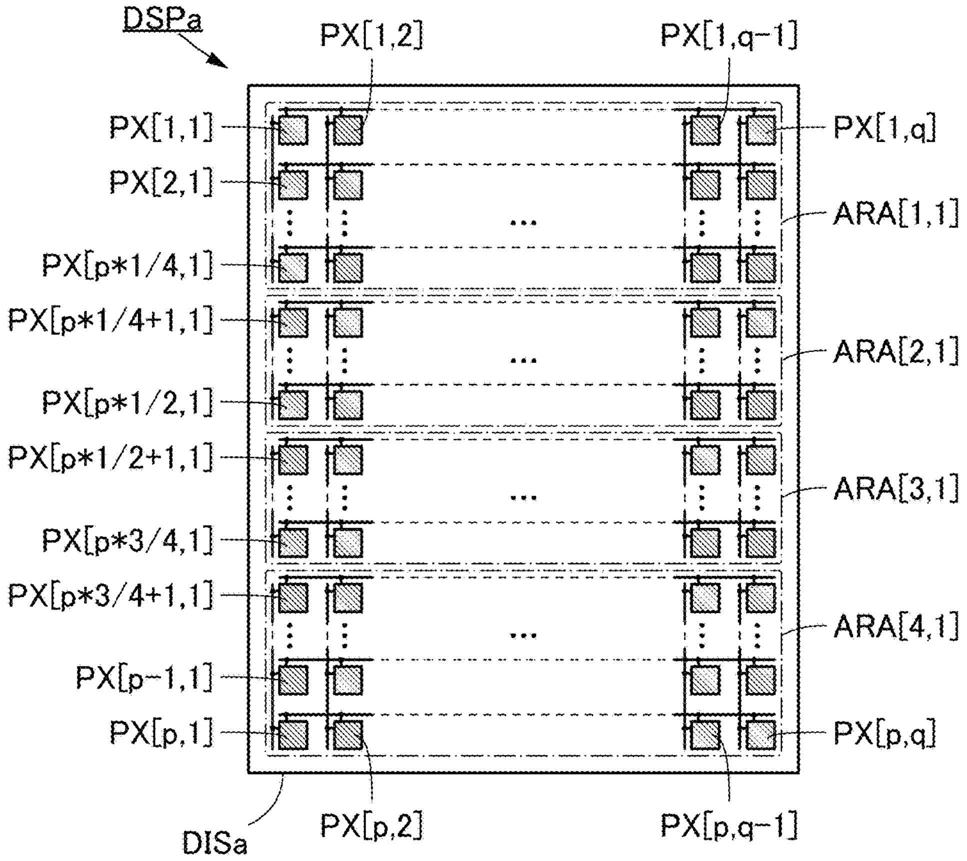
FIG. 5A is a diagram illustrating a structure example of a display apparatus.

FIG. 5A is a block diagram illustrating a structure of a display apparatus DSPa in which a display portion is divided into regions of four rows and one column. That is, the structure of the display apparatus DSPa corresponds to the above-described display apparatus DSP of the case where m=4 and n=1. Accordingly, the above description of the display apparatus DSP can be referred to as appropriate, and thus description is omitted here in some cases.

A display portion DISa includes the display region ARA [1,1] to a display region ARA[4,1]. The display portion DISa includes a plurality of pixels PX arranged in a matrix of p rows and q columns (p is a positive multiple of m and q is a positive multiple of n). That is, since m=4 and n=1 here, each of the display region ARA[1,1] to the display region ARA[4,1] includes a plurality of pixels PX arranged in a matrix of p/4 rows and q columns.

That is, the display region ARA[1,1] includes a pixel PX[1,1] to a pixel PX[p×¼,q], the display region ARA[2,1] includes a pixel PX[p×¼+1,1] to a PX[p×½,q], the display region ARA[3,1] includes a pixel PX PX[p×½+1,1] to a pixel PX[p×¾,q], and the display region ARA[4,1] includes a pixel PX[p×¾+1,1] to a pixel PX[p,q]. Note that in this specification, drawings, and the like, a multiplier symbol "x" is expressed as "*" in some cases. That is, for example, in FIG. 5A, "p×¼" is expressed as "p*¼", "p×¼" is expressed as "p*¼", and "p×¼" is expressed as "p*¼". The same applies to FIG. 5B and FIG. 7, which are described later.

For example, when the definition of the display apparatus DSPa is 8K4K, the display portion DISa includes a plurality of pixels PX arranged in a matrix of 7680 rows and 4320 columns (corresponding to the case where p=7680 and q=4320). In that case, each of the display region ARA[1,1] to the display region ARA[4,1] includes a plurality of pixels PX arranged in a matrix of 1920 rows and 4320 columns.

Although not illustrated in FIG. 5A, the display apparatus DSPa includes the circuit region ARD[1,1] to a circuit region ARD[4,1], which correspond to the display region ARA[1,1] to the display region ARA[4,1], respectively. Each of the circuit region ARD[1,1] to the circuit region ARD[4,1] includes the driver circuit SD and the driver circuit GD. An image signal corresponding to image data is written to each of the plurality of pixels PX by the corresponding driver circuit SD and the corresponding driver circuit GD.

Although not illustrated in FIG. 5A, each of the plurality of pixels PX includes a light-emitting element. The light-emitting element included in each of the plurality of pixels PX can emit light with emission intensity based on the image signal written to the pixel PX. That is, the emission intensity of the light-emitting element can be controlled by the image signal written to the pixel PX.

The light-emitting element included in each of the plurality of pixels PX can be brought into a light-emitting state or a non-light-emitting state by the corresponding driver circuit SD and the corresponding driver circuit GD.

Figure 5B:
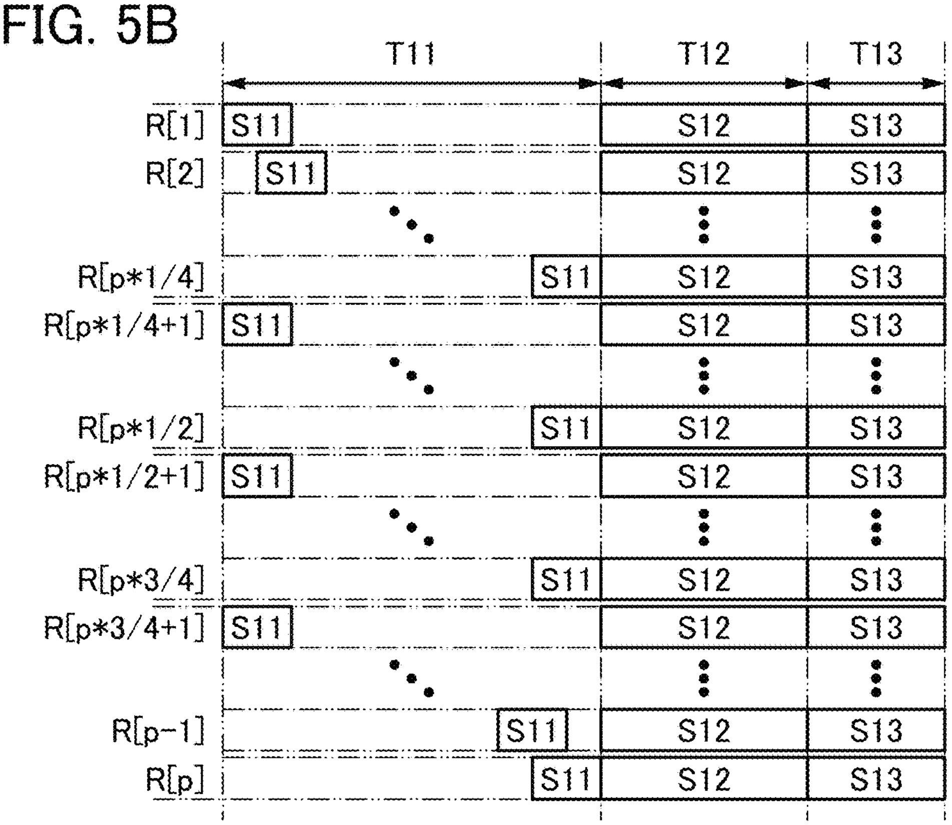
FIG. 5B is a diagram illustrating a driving method example of the display apparatus.

FIG. 5B is a diagram illustrating an example of a method for driving the display apparatus DSPa, illustrating an operation of each pixel PX in one frame period. A row R[1] shows operations of the pixels of q columns arranged in the first row of the display portion DISa (the pixel PX[1,1] to the pixel PX[1,q]). Similarly, a row R[2], a row R[p×¼], a row R[p×¼+1], a row R[p×½], a row R[p×½+1], a row R[p×¾], a row R[p×¾+1], a row R[p−1], and a row R[p] show operations of the pixels of q columns arranged in the second row, the pixels of q columns arranged in the p×¼-th row, the pixels of q columns arranged in the p×¼+1-th row, the pixels of q columns arranged in the p×½-th row, the pixels of q columns arranged in the p×½+1-th row, the pixels of q columns arranged in the p×¾-th row, the pixels of q columns arranged in the p×¾+1-th row, the pixels of q columns arranged in the p−1-th row, and the pixels of q columns arranged in the p-th row, respectively. Note that a row R[3] to a row R[p×¼-1], a row R[p×¼+2] to a row R[p×½-1], the row R[p×¼+2] to the row R[p×½-1], a row R[p×½+2] to a row R[p×¾-1], and a row R[p×¾+2] to a row R[p−2] are omitted in the diagram.

[Operation in Period T11]

An operation of the display apparatus DSPa in Period T11 is described. Period T11 is a period in which an image signal based on image data is written to each pixel PX of the display portion DISa (illustrated as Operation S11 in FIG. 5B). Note that in Period T11, the light-emitting element included in each of the pixels PX can be in a non-light-emitting state. In Period T11, an image signal is sequentially written row by row in each of the display region ARA[1,1] to the display region ARA[4,1]. That is, an operation of sequentially writing an image signal row by row in the display region ARA[1,1] (the row R[1] to the row R[p×¼]), an operation of sequentially writing an image signal row by row in the display region ARA[2,1] (the row R[p×¼+1] to the row R[p×½]), an operation of sequentially writing an image signal row by row in the display region ARA[3,1] (the row R[p×½+1] to the row R[p×¾]), and an operation of sequentially writing an image signal row by row in the display region ARA[4,1] (the row R[p×¾+1] to the row R[p]) can be performed at the same time. By performing such operations, the time required for writing image signals to all the pixels PX in the display portion DISa is, for example, one fourth of the time required for writing image signals sequentially to the entire display portion DISa (the row R[1] to the row R[p]) row by row without dividing the display portion DISa into display regions of a plurality of rows.

Although the case where the display portion is divided into display regions of four rows (corresponding to the case where m=4) is described here as an example, one embodiment of the present invention is not limited thereto. The number of rows of the display regions into which the display portion is divided may be two (corresponding to the case where m=2), three (corresponding to the case where m=3), or five or more (corresponding to the case where m is an integer greater than or equal to 5). When the number of rows of the display regions into which the display portion is divided is set to m, the number of rows of pixels arranged per display region is to p/m. Thus, when an operation of sequentially writing an image signal row by row is performed in each display region, and the operation is performed in all the display regions at the same time, the time required for writing image signals to all the pixels in the display portion is 1/m of that in the case where the display portion is not divided into display regions of a plurality of rows.

[Operation in Period T12]

An operation of the display apparatus DSPa in Period T12 is described. Period T12 is a period in which the light-emitting element included in each of the pixels PX in the display portion DISa is brought into a light-emitting state (illustrated as Operation S12 in FIG. 5B). When the light-emitting element is brought into a light-emitting state, the light-emitting element can emit light with emission intensity based on the image signal written to the pixel PX including the light-emitting element. That is, an image based on the image data is displayed on the display portion DISa. In Period T12, an operation of bring the light-emitting elements included in all the pixels PX in the display portion DISa into a light-emitting state simultaneously is performed.

[Operation in Period T13]

An operation of the display apparatus DSPa in Period T13 is described. Period T13 is a period in which the light-emitting element included in each of the pixels PX in the display portion DISa is brought into a non-light-emitting state (illustrated as Operation S13 in FIG. 5B). When the light-emitting element is brought into a non-light-emitting state, the light-emitting element is quenched (light emission is stopped). That is, black is displayed on the display portion DISa. In Period T13, the light-emitting elements included in all the pixels PX in the display portion DISa are brought into a non-light-emitting state simultaneously.

Displaying black on the display portion for a certain period of one frame period in the above-described manner is referred to as "black insertion" in some cases. Furthermore, such a driving method is referred to as "black insertion driving" in some cases. The "black insertion driving" is also referred to as a "pseudo impulsive type" or "pseudo impulsive driving".

With the use of black insertion driving, an afterimage, an image blur, and the like in displaying a moving image can be reduced as compared with the case where black insertion driving is not performed, and it is possible to improve the sharpness of the moving image (which can be evaluated by measuring modulation transfer function (MTF), which is an index indicating how fine pattern the contrast can be maintained (expressed) in actual display, with respect to the contrast of input image data). Accordingly, a decrease in definition that a person feels at the time of displaying a moving image (also referred to as "moving image definition") can be inhibited, so that displaying a moving image with high display quality can be achieved.

Note that performing black insertion simultaneously in the whole display portion as in Period T13 shown in FIG. 5B is sometimes referred to as global black insertion.

The global black insertion can be suitably used as a method for driving a display apparatus provided in a VR device or the like having an eye tracking function, for example. Performing the global black insertion makes it possible to conduct gaze sensing required for eye tracking in the black insertion period (Period T13). Thus, it is not necessary to provide another period for gaze sensing.

Meanwhile, a period that can be assigned as a period in which image signals are written to all the pixels of the display portion (Period T11) is shortened by the period in which the light-emitting element is brought into a light-emitting state (Period T12) and a period in which the light-emitting element is brought into a non-light-emitting state (Period T13) in one frame period.

Thus, as in Period T11 shown in FIG. 5B, the display portion is divided into display regions of a plurality of rows, an image signal is sequentially written row by row in each of the display regions, and such an operation is performed in all the display regions at the same time, whereby the time required for writing image signals to all the pixels of the display portion can be shortened. Consequently, the operating speed of the display apparatus can be increased.

For example, even when the number of rows of pixels provided in the display portion is increased, it is possible to reduce the number of rows of pixels provided in one display region by increasing the number of rows of divided display regions. Thus, a period that can be assigned as a period in which image signals are written to the pixels of one row (a period of Operation S11) can be ensured sufficiently. Thus, the definition of the display apparatus can be increased.

Although the case where the number of columns of display regions into which the display portion is divided is one (corresponding to the case where n=1) and column division is not performed is described here as an example, one embodiment of the present invention is not limited thereto. The number of columns of display regions into which the display portion is divided may be two (corresponding to the case where n=2) or three or more (corresponding to the case where n is an integer greater than or equal to 3). When the number of columns of display regions into which the display portion is divided is n, the number of columns of pixels arranged in one display region is q/n. That is, the number of pixels driven by the corresponding driver circuit of the display region is 1/n as compared with the case where the display portion is not divided into display regions of a plurality of columns. Thus, a load due to driving by the driver circuit is reduced, and the time required for writing image signals to the pixels of one row can be shortened. Consequently, the operating speed of the display apparatus can be increased.

Note that the case where the operation of sequentially writing an image signal row by row in each display region is performed in all the display regions at the same time is described here as an example; however, one embodiment of the present invention is not limited thereto. For example, the timing of starting the operation of sequentially writing an image signal row by row may differ among the display regions. Furthermore, for example, the operation speed of the operation of writing an image signal row by row may differ among the display regions.

Although the case where the same number of pixels are arranged in the display regions is described here as an example, one embodiment of the present invention is not limited thereto. The numbers of pixels arranged in the display regions may be different from each other.

Note that in this specification and the like, “all” means almost all or substantially all and does not necessarily mean all completely. For example, “all the display regions” do not necessarily mean completely all the display regions, and 80% or more, preferably 90% or more, further preferably 95% or more, still further preferably 99% or more of the number of display regions is expressed as “all the display regions”. For example, “all the pixels” do not necessarily mean all the pixels completely, and 80% or more, preferably 90% or more, further preferably 95% or more, still further preferably 99% or more of the number of pixels is expressed as “all the pixels”.

Note that in this specification and the like, “the same time” means almost the same time or substantially the same time and does not necessarily mean the same time completely. For example, a few time difference due to signal delay or the like in a wiring is regarded as being within as an error range, in which case the expression “the same time” can be used. For example, a few time difference within 20%, preferably within 10%, further preferably within 5%, still further preferably within 1% with respect to a one-frame time is regarded as being “the same time”.

Note that in this specification and the like, “simultaneous” means almost simultaneous or substantially simultaneous and does not necessarily mean simultaneous completely. For example, “a plurality of light-emitting elements are brought into a light-emitting state or a non-light-emitting state simultaneously” does not necessarily mean that all the light-emitting elements are brought into a light-emitting state or a non-light-emitting state simultaneously. For example, even the case where some of the plurality of light-emitting elements are difficult to be in a light-emitting state or a non-light-emitting state owing to a malfunction or a defect of a display apparatus is expressed as “the plurality of light-emitting elements are brought into a light-emitting state or a non-light-emitting state simultaneously”. For example, even the case where there is a few time difference in the timing when the plurality of light-emitting elements are brought into a light-emitting state or a non-light-emitting state owing to signal delay or the like in a wiring is expressed as “the plurality of light-emitting elements are brought into a light-emitting state or a non-light-emitting state simultaneously”. For example, the case of bringing 80% or more of a plurality of light-emitting elements into a light-emitting state or a non-light-emitting state within a time difference of 20% or less of a one-frame time, preferably 90% or more of a plurality of light-emitting elements into a light-emitting state or a non-light-emitting state within a time difference of 10% or less of a one-frame time, further preferably 95% or more of a plurality of light-emitting elements into in a light-emitting state or a non-light-emitting state within a time difference of 5% or less of a one-frame time, still further preferably 99% or more of the plurality of light-emitting elements into a light-emitting state or a non-light-emitting state within a time difference of 1% or less of a one-frame time is expressed as “the plurality of light-emitting elements are brought into a light-emitting state or a non-light-emitting state simultaneously”.

<Structure Example of Pixel>

Figure 6:
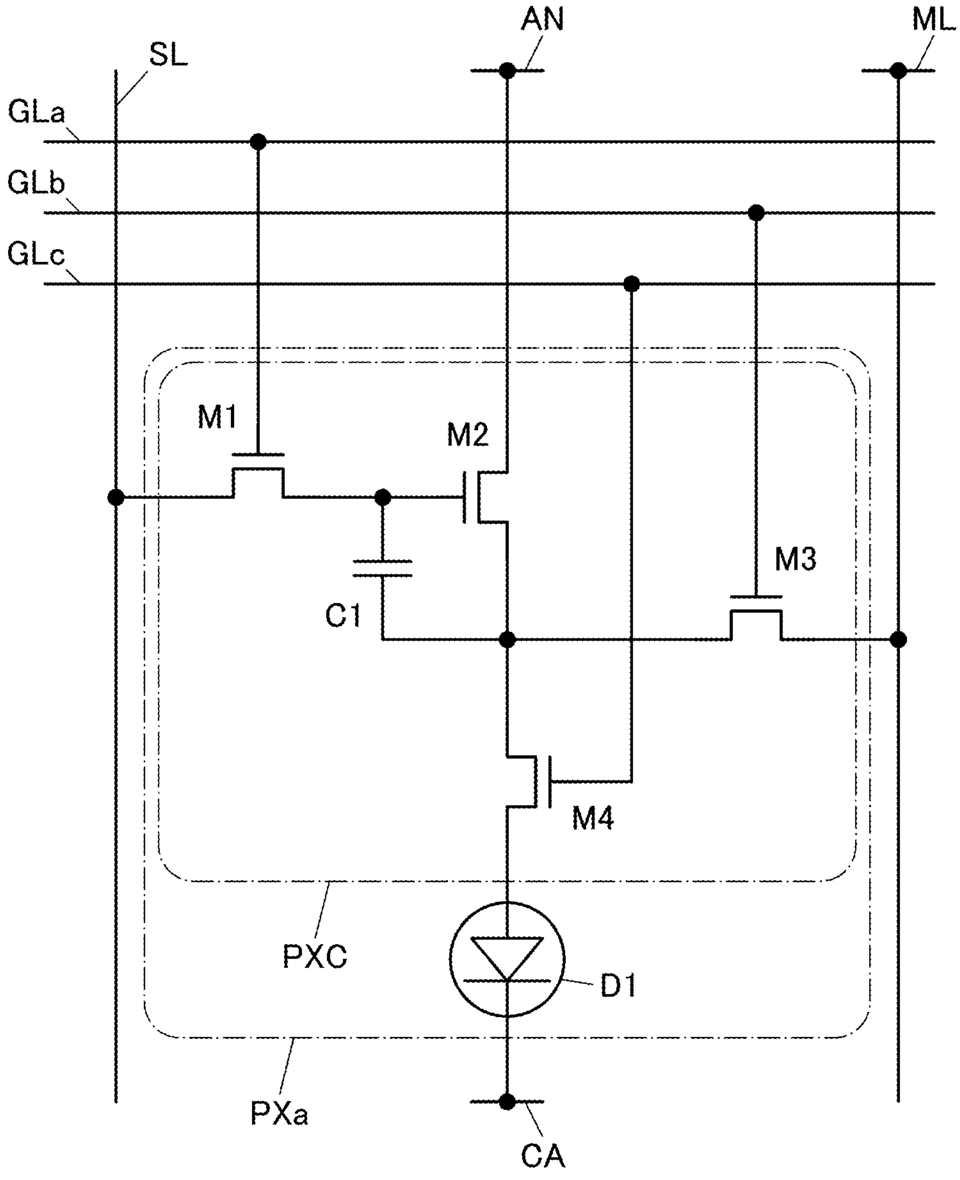
FIG. 6 is a diagram illustrating an example of a pixel circuit.

FIG. 6 is a diagram illustrating an example of the circuit structure of the pixel PX. A pixel PXa illustrated in FIG. 6 includes a pixel circuit PXC and a light-emitting element D1. The pixel circuit PXC includes a transistor M1 to a transistor M4 and a capacitor C1. Note that the transistor M1 to the transistor M4 are n-channel transistors.

A gate of the transistor M1 is electrically connected to a wiring GLa. One of a source and a drain of the transistor M1 is electrically connected to a gate of the transistor M2. The other of the source and the drain of the transistor M1 is electrically connected to a wiring SL. The transistor M1 has a function of establishing or breaking electrical continuity between the gate of the transistor M2 and the wiring SL.

The gate of the transistor M2 is electrically connected to one terminal of the capacitor C1. One of a source and a drain of the transistor M2 is electrically connected to the other terminal of the capacitor C1. The other of the source and the drain of the transistor M2 is electrically connected to a wiring AN.

A gate of the transistor M3 is electrically connected to a wiring GLb. One of a source and a drain of the transistor M3 is electrically connected to the one of the source and the drain of the transistor M2. The other of the source and the drain of the transistor M3 is electrically connected to a wiring ML. The transistor M3 has a function of establishing or breaking electrical continuity between the one of the source and the drain of the transistor M2 and the wiring ML.

A gate of the transistor M4 is electrically connected to a wiring GLc. One of a source and a drain of the transistor M4 is electrically connected to the one of the source and the drain of the transistor M2. The other of the source and the drain of the transistor M4 is electrically connected to one terminal (e.g., an anode terminal) of the light-emitting element D1. The transistor M4 has a function of establishing or breaking electrical continuity between the one of the source and the drain of the transistor M2 and the one terminal of the light-emitting element D1.

The other terminal (e.g., a cathode terminal) of the light-emitting element D1 is electrically connected to a wiring CA.

The light-emitting element D1 emits light with emission intensity corresponding to the amount of current flowing through the light-emitting element D1. As the light-emitting element D1, any of a variety of display elements such as an EL element (an EL element containing an organic substance and an inorganic substance, an organic EL element, and an inorganic EL element), a light-emitting diode (LED), a micro LED (e.g., an LED where the area of a light-emitting region is less than or equal to 10000 $\mu m^2$), a QLED (Quantum-dot Light Emitting Diode), and an electron emitter element can be used, for example.

Note that the transistor M2 has a function of controlling the amount of current flowing through the light-emitting element D1. That is, the transistor M2 has a function of controlling the emission intensity of the light-emitting element D1.

The capacitor C1 has, for example, a function of retaining a potential difference (voltage) between the one of the source and the drain of the transistor M2 and the gate of the transistor M2 at the time when the transistor M1 is in an off state.

Note that the circuit structure example of the pixel PXa illustrated in FIG. 6 is an example of a circuit structure of a pixel that can be used in the display apparatus of one embodiment of the present invention, and is not limited thereto. A variety of circuit structures can be employed in a pixel that can be used for the display apparatus of one embodiment of the present invention without departing from the spirit of the present invention.

For example, a transistor that establishes or breaks electrical continuity between the wiring AN and the other of the source and the drain of the transistor M2 may be provided without providing the transistor M4. Alternatively, for example, a transistor that establishes or breaks electrical continuity between the other terminal of the light-emitting element D1 and the wiring CA may be provided without providing the transistor M4. Alternatively, for example, a transistor that establishes or breaks electrical continuity between the gate of the transistor M2 and the wiring CA may be provided.

Alternatively, for example, a transistor, a capacitor, or the like may be provided as appropriate, whereby a function of correcting the threshold voltage or field-effect mobility of the transistor M2 may be provided. For example, a transistor, a capacitor, or the like may be provided as appropriate, whereby a function of retaining charge in the gate of the transistor M2 over a plurality of frames may be provided. Furthermore, for example, a wiring may be provided as appropriate in accordance with the circuit structure of the pixel. Moreover, for example, p-channel transistors may be used as some or all of the transistors included in the pixel.

<Operation Example of Pixel>

Next, an operation of writing an image signal (corresponding to Operation S11 in FIG. 5B), an operation of bringing a light-emitting element into a light-emitting state (corresponding to Operation S12 in FIG. 5B), and an operation of bringing a light-emitting element into a non-light-emitting state (corresponding to Operation S13 in FIG. 5B) of the case where the pixel PXa illustrated in FIG. 6 is used in the display apparatus DSPa illustrated in FIG. 5A are described.

Figure 7:
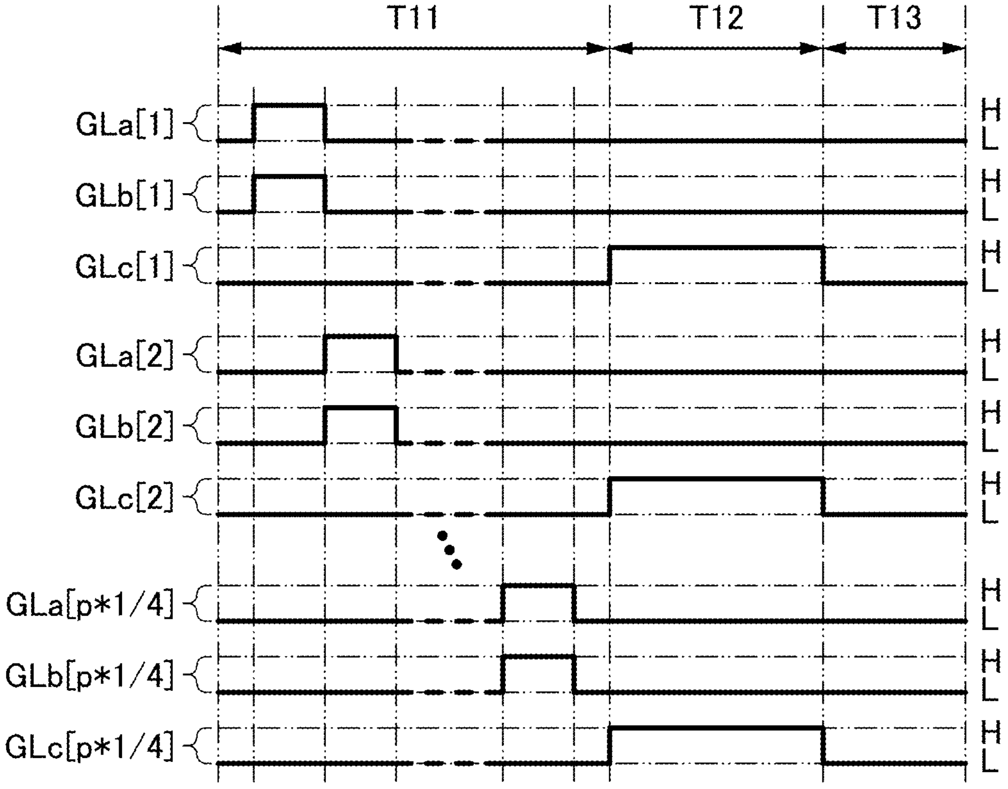
FIG. 7 is a timing chart illustrating an operation example of a pixel circuit.

FIG. 7 is a timing chart showing an operation example of the pixel PXa of the case where the pixel PXa illustrated in FIG. 6 is used in the display apparatus DSPa illustrated in FIG. 5A. A timing chart of the pixels PXa arranged in the first row, the second row, and the p×¼-th row is shown in FIG. 7 selectively from a timing chart of the pixels PXa arranged in the first row to the p×¼-th row. In FIG. 7, the pixel PXa arranged in the first row is shown by a wiring GLa[1], a wiring GLb[1], and a wiring GLc[1]. The pixel PXa arranged in the second row is shown by a wiring GLa[2], a wiring GLb[2], and a wiring GLc[2]. The pixel PXa arranged in the p×¼-th row is shown by a wiring GLa[p×¼], a wiring GLb[p×¼], and a wiring GLc[p×¼]. Note that a timing chart of the pixels PXa arranged in the p×¼+1-th row to the p×½-th row, a timing chart of the pixels PXa arranged in the p/2+1-th row to the p×¾-th row, and a timing chart of the pixels PXa arranged in the p×¾+1-th row to the p-th row are the same as the timing chart of the pixels PXa arranged in the first row to the p×¼-th row; thus, the illustration and description thereof are omitted.

Although not illustrated here, an image signal Vdata is supplied to the wiring SL from the driver circuit SD corresponding to the pixel PXa, for example. A potential H or a potential L is supplied to each of the wiring GLa, the wiring GLb, and the wiring GLc from the driver circuit GD corresponding to the pixel PXa, for example. The potential H is preferably higher than the potential L. Note that in this embodiment and the like, the "potential H" is a potential that turns on an n-channel transistor when being input to a gate of the n-channel transistor. The "potential L" is a potential that turns off an n-channel transistor when being input to a gate of the n-channel transistor.

For example, a constant potential higher than the potential of the image signal Vdata is supplied to the wiring AN. For example, a potential V0 lower than the image signal Vdata is supplied to the wiring ML. For example, a constant potential lower than the potential V0 is supplied to the wiring CA.

[Writing of Image Signal]

In Period T11, an operation of writing an image signal described below (corresponding to Operation S11 in FIG. 5B) is performed row by row sequentially for the pixels PXa of the first row to the p/4-th row.

First, the potential H is supplied to the wiring GLa and the wiring GLb. The potential of the wiring GLc remains the potential L. Then, the transistor M1 is turned on, whereby the image signal Vdata is supplied from the wiring SL to the gate of the transistor M2. In addition, the transistor M3 is turned on, whereby the potential V0 is supplied from the wiring ML to the one of the source and the drain of the transistor M2. Since the transistor M4 is in an off state, the light-emitting element D1 is in a non-light-emitting state. Accordingly, the voltage between the gate and the source of the transistor M2 becomes the image signal Vdata−the potential V0. After that, the potential L is supplied to the wiring GLa and the wiring GLb, whereby writing of the image signal Vdata is completed.

[Light Emission of Light-Emitting Element]

In Period T12, an operation of bringing a light-emitting element into a light-emitting state (corresponding to Operation S12 in FIG. 5B), which is described below, is performed simultaneously in the pixels PXa of the first row to the p/4 row.

The potential H is supplied to the wiring GLc. Then, the transistor M4 is turned on, and a current Id corresponding to the voltage between the gate and the source of the transistor M2 (the image signal Vdata−the potential V0) flows from the wiring AN to the wiring CA through the transistor M2, the transistor M4, and the light-emitting element D1. Then, the light-emitting element D1 emits light with emission intensity corresponding to the current Id flowing through the light-emitting element D1. In other words, the light-emitting element D1 emits light with emission intensity corresponding to the image signal Vdata written in Period T11.

[Quenching of Light-Emitting Element]

In Period T13, an operation of bringing a light-emitting element into a non-light-emitting state (corresponding to Operation S13 in FIG. 5B), which is described below, is performed simultaneously in the pixels PXa of the first row to the p/4 row.

The potential L is supplied to the wiring GLc. Then, the transistor M4 is turned off, and no current flows through the light-emitting element D1. Then, the light-emitting element D1 is quenched (light emission is stopped). Thus, the display becomes black.

Note that the operation example of the pixels PXa illustrated in FIG. 7 is an example of an operation of pixels that can be used of the display apparatus of one embodiment of the present invention, and is not limited thereto. A variety of operations can be employed as an operation of pixels that can be used in the display apparatus of one embodiment of the present invention without departing from the spirit of the present invention.

For example, since the light-emitting element D1 is in a non-light-emitting state in Period T11, Period T11 may also serve as Period T13. That is, an operation of writing an image signal may start at the same time as an operation of bringing the light-emitting element into a non-light-emitting state. Such an operation can increase the operation speed of the display apparatus.

Alternatively, for example, a period in which the potential H is supplied to the wiring GLb and the potential L is supplied to the wiring GLa and the wiring GLc may be provided. By providing such a period, the current Id corresponding to the voltage between the gate and the source of the transistor M2 (the image signal Vdata−the potential V0) may be measured outside the pixel PXa through the wiring ML. Accordingly, a structure having a function of correcting the image signal on the basis of the measured value can be obtained.

<Layer Structure Example of Display Apparatus>

Figure 8A:
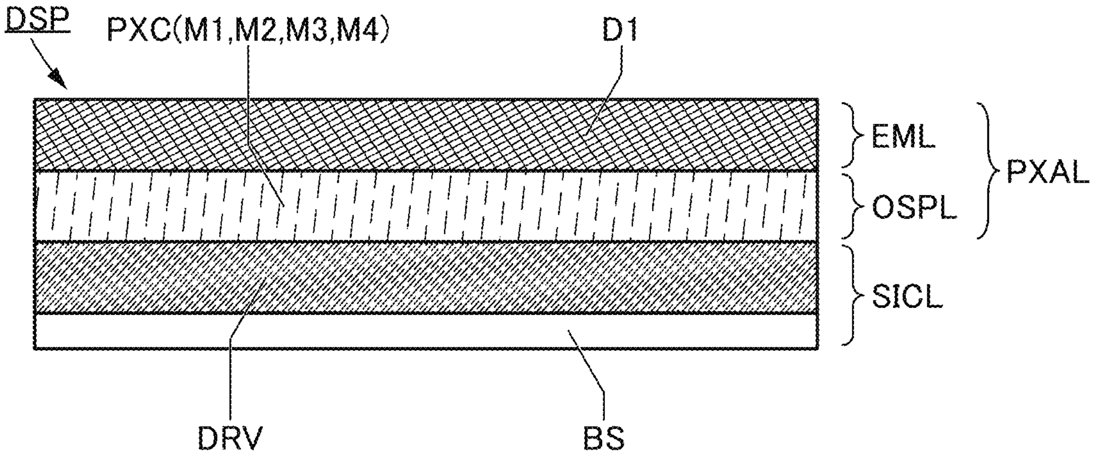
FIG. 8A to FIG. 8C are schematic cross-sectional views illustrating structure examples of a display apparatus.

FIG. 8A illustrates an example of the display apparatus DSP illustrated in FIG. 1A in which the pixel layer PXAL includes a layer OSPL and a layer EML over the layer OSPL. For example, in the pixel PXa illustrated in FIG. 6, the transistor M1 to the transistor M4 included in the pixel circuit PXC can be provided in the layer OSPL, and the light-emitting element D1 can be provided in the layer EML.

Transistors including any of a variety of semiconductors can be used as the transistors provided in the circuit layer SICL and the transistors provided in the layer OSPL. For example, a transistor containing a single crystal semiconductor, a polycrystalline semiconductor, a microcrystalline semiconductor, or an amorphous semiconductor in a channel formation region can be used. Furthermore, for example, a compound semiconductor (e.g., silicon germanium (SiGe) or gallium arsenide (GaAs)), an oxide semiconductor, or the like as well as a single element semiconductor whose main component is a single element (e.g., silicon (Si) or germanium (Ge)) can be used.

Transistors with a variety of structures can be used as the transistors provided in the circuit layer SICL and the transistors provided in the layer OSPL. For example, any of transistors having a variety of structures of a planar type, a FIN-type, a TRI-GATE type, a top-gate type, a bottom-gate type, and a dual-gate type (a structure in which gates are placed above and below a channel) can be used. A MOS transistor, a junction transistor, a bipolar transistor, or the like can be used, for example, as the transistor of one embodiment of the present invention.

The transistors provided in the circuit layer SICL and the transistors provided in the layer OSPL may be a plurality of kinds of transistors using different semiconductor materials. For example, the transistors provided in the circuit layer SICL may be Si transistors (transistors including silicon in semiconductor layers where channels are formed) and the transistors provided in the layer OSPL may be OS transistors (transistors including an oxide semiconductor in semiconductor layers where channels are formed). That is, in the display apparatus DSP, the driver circuit SD and the driver circuit GD included in the driver circuit region DRV included in the circuit layer SICL can be formed using Si transistors, and the pixel circuit PXC included in the layer OSPL can be formed using OS transistors, for example.

A Si transistor has higher operation speed than an OS transistor. For example, by electrically connecting a gate of an n-channel Si transistor and a gate of a p-channel Si transistor, a CMOS circuit (e.g., a circuit that operates complementarily, a CMOS logic gate, a CMOS logic circuit, or the like) can be formed. Thus, the display apparatus DSP can increase the operation speeds of the driver circuit SD and the driver circuit GD and can reduce power consumption in a steady state.

An oxide semiconductor where a channel of an OS transistor is formed has a band gap of 2 eV or more; thus, an off-state current (a current flowing between a source and a drain when the transistor is in an off state) is extremely low. Therefore, an OS transistor is preferably used as a transistor functioning as a switch. For example, an OS transistor is preferably used as each of the transistor M1, the transistor M3, and the transistor M4 in the pixel circuit PXC. For example, when an OS transistor is used as the transistor M1, charge in the gate of the transistor M2 can continue to be retained during an off state of the transistor M1. That is, after writing of the image signal Vdata is completed in Operation S11 in Period T11, the written image signal Vdata can continue to be stored during Period T12 and Period T13.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is greater than or equal to 1 fA ($1\times10^{-15}$ A) and less than or equal to 1 pA ($1\times10^{-12}$ A). In other words, the off-state current of the OS transistor is lower than that of the Si transistor by approximately ten orders of magnitude.

When an OS transistor is used as each of the transistors included in the pixel circuit PXC, charge written to the nodes can be retained for a long period. For example, in the case of displaying a still image for which rewriting every frame is not required, displaying an image can be kept even when the operation of a peripheral driver circuit is stopped. Such a driving method in which the operation of a peripheral driver circuit is stopped during displaying a still image is also referred to as "idling stop driving". The power consumption of a display device can be reduced by performing idling stop driving.

The off-state current of an OS transistor hardly increases even in a high-temperature environment. Specifically, the off-state current of an OS transistor hardly increases even at an environment temperature higher than or equal to room temperature and lower than or equal to 200° C. Furthermore, the on-state current of an OS transistor is unlikely to decrease even in a high-temperature environment. A display apparatus including an OS transistor can operate stably and have high reliability even in a high-temperature environment.

An OS transistor has a higher withstand voltage between its source and drain than a Si transistor with the same channel size as the OS transistor. The use of an OS transistor as each of the transistors included in the pixel circuit PXC makes the operation stable even in the case where a potential difference (voltage) between a potential supplied to the wiring AN (also referred to as an anode potential) and a potential supplied to the wiring CA (also referred to as a cathode potential) is large, whereby a highly reliable display apparatus can be achieved. It is particularly preferable to use an OS transistor as one or both of the transistor M2 and the transistor M4.

The semiconductor layer of the OS transistor preferably contains at least one of indium and zinc. The semiconductor layer of the OS transistor preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, the element M is preferably one or more kinds selected from gallium, aluminum, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn)

(also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. The atomic ratio of In may be smaller than the atomic ratio of M in the In-M-Zn oxide. Examples of the atomic ratio of the metal elements in such an In-M-Zn oxide include In:M:Zn=1:3:2 or a composition in the neighborhood thereof or In:M:Zn=1:3:4 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the content ratio of each element is as follows; Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the content ratio of each element is as follows; Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where the content ratio of each element is as follows; Ga is greater than 0.1 and less than or equal to 2 and Zn is greater than 0.1 and less than or equal to 2 with In being 1.

Note that some or all of the transistors included in the pixel circuit PXC may each be a transistor having a back gate. When the same potential as the potential of the source is supplied to the back gate, for example, an electric field generated outside the transistor is unlikely to affect the channel formation region, and consequently the electrical characteristics of the transistor can be stabilized and the reliability of the transistor can be provided. For example, when the back gate of the transistor is supplied with the same potential as the potential supplied to the gate, the on-state resistance of the transistor can be reduced. Furthermore, for example, a given potential is supplied to the back gate, the threshold voltage of the transistor can be changed. Note that the potential supplied to the back gate is not limited to a fixed potential. In addition, for example, the potentials supplied to the back gates of the transistors included in the pixel circuit PXC may be different from one another or may be the same.

Note that in this embodiment and the like, for example, some of the transistors included in the driver circuit SD and the driver circuit GD may be OS transistors in the display apparatus DSP of one embodiment of the present invention. For example, in the case where the driver circuit SD and the driver circuit GD each include a level shifter LS, a transistor included in the level shifter LS may be an OS transistor. An OS transistor has a higher withstand voltage between its source and drain than a Si transistor with the same channel size as the OS transistor. Thus, with the use of an OS transistor as the transistor included in the level shifter, a voltage can be increased to be higher than the withstand voltage of a Si transistor. Furthermore, a display apparatus with stable operation and high reliability even when a high voltage is applied can be obtained.

Figure 8B:
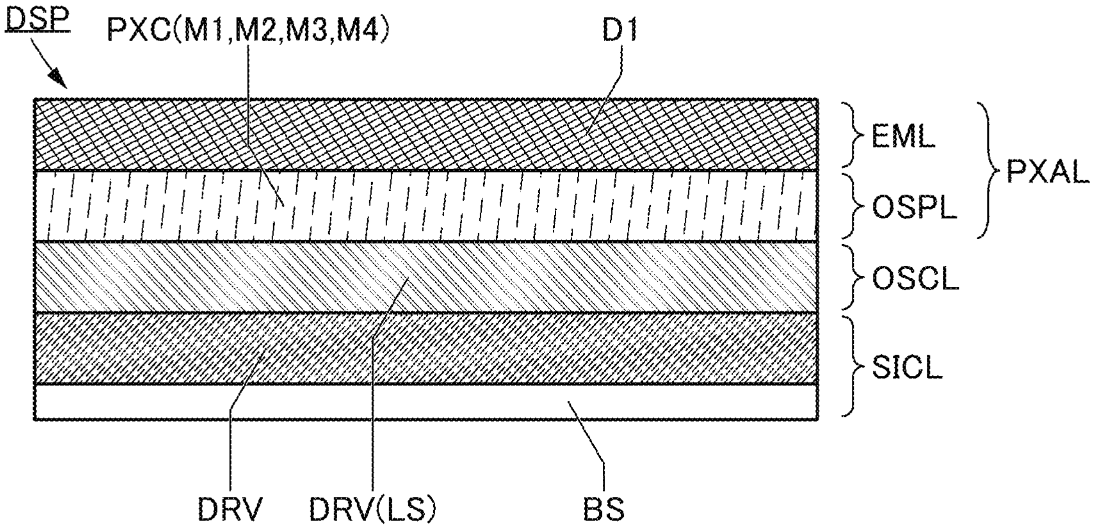

FIG. 8B illustrates an example where a circuit layer OSCL is provided over the circuit layer SICL in the display apparatus DSP illustrated in FIG. 8A. For example, among the transistors included in the driver circuit SD and the driver circuit GD, an OS transistor (e.g., the transistor included in the level shifter LS) can be provided in the circuit layer OSCL, and a Si transistor (e.g., a transistor included in a component other than the level shifter LS) can be provided in the circuit layer SICL.

Note that in this embodiment and the like, the pixel circuit PXC in the display apparatus DSP of one embodiment of the present invention may be formed with a plurality of kinds of transistors including different semiconductor materials. For example, the pixel circuit PXC may be formed with a transistor containing low-temperature polysilicon (LTPS) in its semiconductor layer (hereinafter also referred to as an LTPS transistor) and an OS transistor. An LTPS transistor has high field-effect mobility and excellent frequency characteristics. A structure where an LTPS transistor and an OS transistor are used in combination is referred to as LTPO in some cases.

As for the transistors included in the pixel circuit PXC, it is preferable that OS transistors be used as the transistor M1, the transistor M3, and the transistor M4 and an LTPS transistor be used as the transistor M2, for example. In other words, it is preferable to use an OS transistor as a transistor functioning as a switch for controlling electrical continuity between wirings and an LTPS transistor as a transistor for controlling a current. When LTPO, i.e., both an LTPS transistor and an OS transistor, is used in the pixel circuit PXC, the display apparatus with low power consumption and high driving capability can be achieved.

Figure 8C:
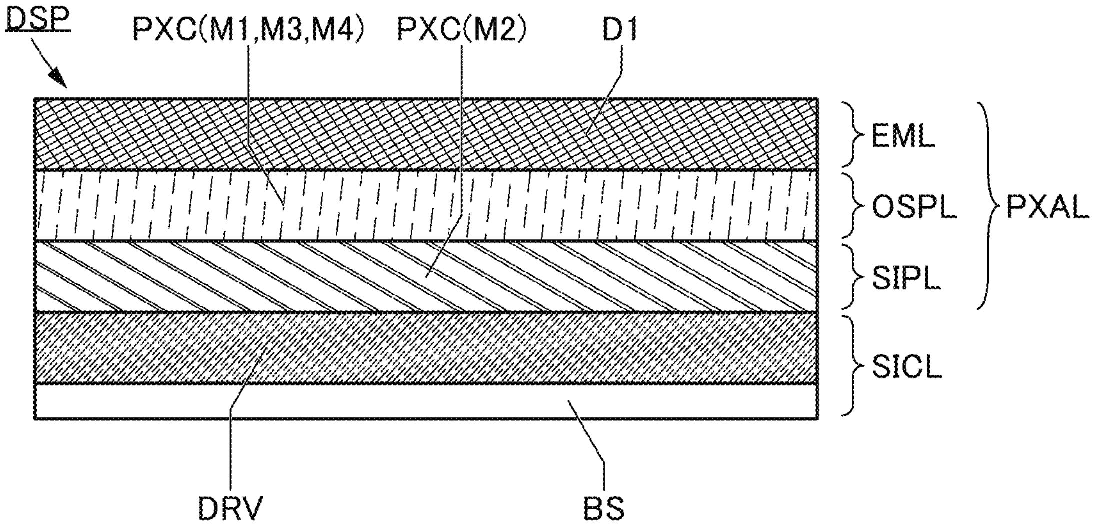

FIG. 8C illustrates an example where the pixel layer PXAL includes a layer SIPL and the layer OSPL provided over the layer SIPL in the display apparatus DSP illustrated in FIG. 8A. For example, in the pixel circuit PXC, an LTPS transistor can be provided in the layer SIPL and an OS transistor can be provided in the layer OSPL.

Note that the display apparatus of one embodiment of the present invention is not limited to the above-described structures illustrated in FIG. 8A to FIG. 8C. For example, the transistors provided in the circuit layer OSCL in FIG. 8B may be Si transistors. Furthermore, for example, a structure including the circuit layer SICL, the circuit layer OSCL over the circuit layer SICL, the layer SIPL over the circuit layer OSCL, and the layer OSPL over the layer SIPL may be employed. As described above, the display apparatus of one embodiment of the present invention can be formed using a plurality of layers including transistors with a variety of structures.

<Structure Example of Control Circuit>

Figure 9:
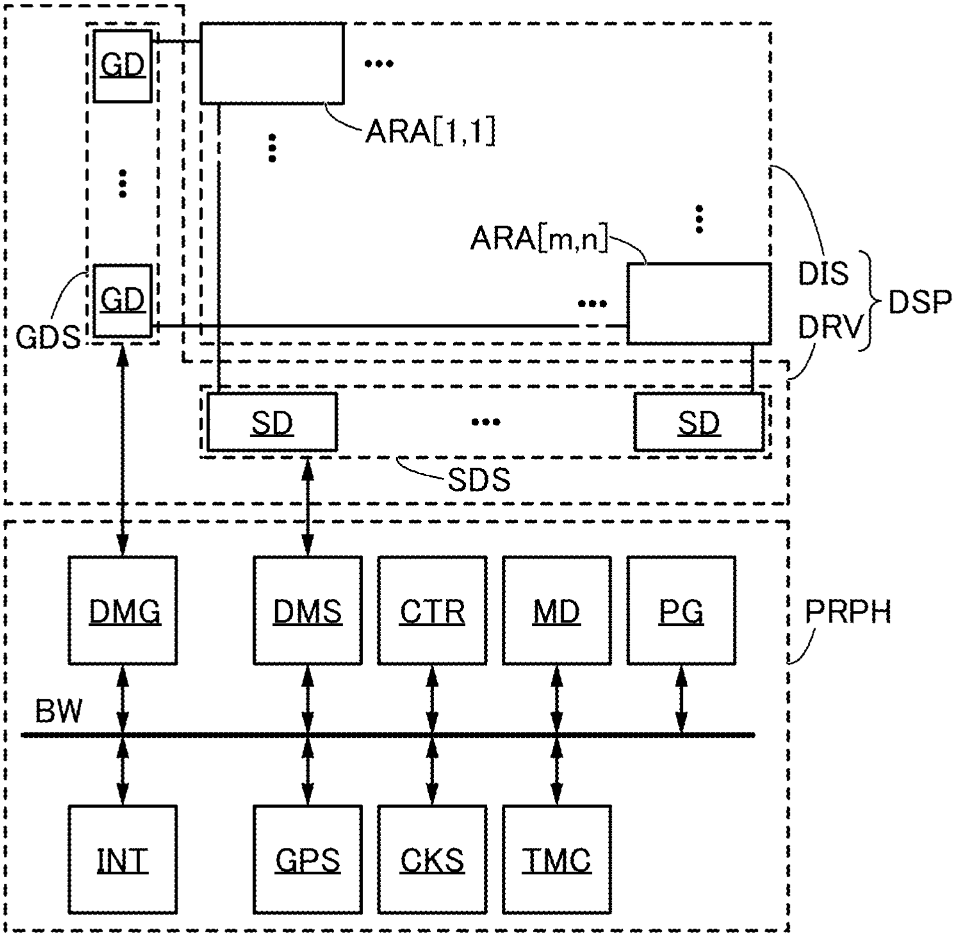
FIG. 9 is a block diagram illustrating a structure example of a display apparatus.

Next, an example of the display apparatus DSP and a control circuit provided outside the display apparatus DSP will be described. FIG. 9 is a block diagram illustrating an example of the display apparatus DSP and a control circuit PRPH.

The display apparatus DSP illustrated in FIG. 9 includes the display portion DIS and the driver circuit region DRV. The driver circuit region DRV includes a circuit GDS including a plurality of driver circuits GD and a circuit SDS including a plurality of driver circuits SD. The control circuit PRPH includes a distribution circuit DMG, a distribution circuit DMS, a control unit CTR, a memory device MD, a voltage generation circuit PG, a timing controller TMC, a clock signal generation circuit CKS, an image processing portion GPS, and an interface INT.

Note that in the display apparatus DSP, the driver circuit region DRV including the plurality of driver circuits GD and the pixel layer PXAL including the plurality of display regions ARA overlap with each other as illustrated in FIG. 2A to FIG. 4; however, FIG. 9 illustrates the plurality of driver circuits GD arranged in a column, for convenience. Similarly, the driver circuit region DRV including the plurality of driver circuits SD and the pixel layer PXAL including the plurality of display regions ARA overlap with each other as illustrated in FIG. 2A to FIG. 4; however, FIG. 9 illustrates the plurality of driver circuits SD arranged in a row, for convenience.

The control circuit PRPH is electrically connected to the outside of the display apparatus DSP illustrated in FIG. 1A to FIG. 4, for example.

The distribution circuit DMG, the distribution circuit DMS, the control unit CTR, the memory device MD, the voltage generation circuit PG, the timing controller TMC, the clock signal generation circuit CKS, the image processing portion GPS, and the interface INT transmit and receive signals mutually through a bus wiring BW.

The interface INT has, for example, a function of a circuit for taking image information output from an external device for displaying an image on the display apparatus DSP into the circuit in the control circuit PRPH. Examples of the external device include a recording media player and a nonvolatile memory device such as an HDD (Hard Disk Drive) and an SSD (Solid State Drive). The interface INT may be a circuit that outputs a signal from a circuit inside the control circuit PRPH to a device outside the display apparatus DSP.

In the case where image information is input from the external device to the interface INT by wireless communication, the interface INT can include, for example, an antenna receiving the image information, a mixer, an amplifier circuit, and an analog-digital conversion circuit.

The control unit CTR has functions of processing control signals transmitted from the external device through the interface INT and controlling circuits included in the control circuit PRPH.

The memory device MD has a function of temporarily retaining information and an image signal. In that case, the memory device MD functions as a frame memory (referred to as a frame buffer in some cases), for example. The memory device MD may have a function of temporarily holding at least one piece of information transmitted from the external device through the interface INT and information processed in the control unit CTR. In that case, at least one of an SRAM (Static Random Access Memory) and a DRAM (Dynamic Random Access Memory) can be used as the memory device MD, for example.

The voltage generation circuit PG has a function of generating power supply voltages supplied to a pixel circuit included in the display portion DIS and a circuit included in the control circuit PRPH. Note that the voltage generation circuit PG may have a function of selecting a circuit to which a voltage is to be supplied. For example, the voltage generation circuit PG stops supply of voltage to the circuit GDS, the circuit SDS, the image processing portion GPS, the timing controller TMC, and the clock signal generation circuit CKS in a period in which a still image is displayed on the display portion DIS, enabling a reduction in the total power consumption of the display apparatus DSP.

The timing controller TMC has a function of generating timing signals used in the plurality of driver circuits GD included in the circuit GDS and the plurality of driver circuits SD included in the circuit SDS. For the generation of the timing signal, a clock signal generated by the clock signal generation circuit CKS can be used.

The image processing portion GPS has a function of performing processing for drawing an image on the display portion DIS. For example, the image processing portion GPS may include a GPU (Graphics Processing Unit). Specifically, the image processing portion GPS is configured to perform pipeline processing in parallel and can thus perform high-speed processing of image data to be displayed on the display portion DIS. The image processing portion GPS can also have a function of a decoder for decoding an encoded image.

In FIG. 9, the image processing portion GPS has a function of receiving image data to be displayed on each of the display region ARA[1,1] to the display region ARA[m,n] and generating an image signal from the image data, for example.

The image processing portion GPS may have a function of correcting the color tone of an image displayed on the display region ARA[1,1] to the display region ARA[m,n]. In that case, the image processing portion GPS is preferably provided with at least one of a dimming circuit and a toning circuit. In the case where the display pixel circuit included in the display portion DIS includes an organic EL element, the image processing unit GPS may be provided with an EL correction circuit.

The above-described image correction may be performed using artificial intelligence. For example, a current flowing in a display device included in a pixel (or a voltage applied to the display device) may be monitored and obtained, an image displayed on the display portion DIS may be obtained with an image sensor or the like, the current (or voltage) and the image may be used as input data in an arithmetic operation of the artificial intelligence (e.g., an artificial neural network), and the output result may be used to determine whether the image is needed to be corrected.

Such an arithmetic operation of artificial intelligence can be applied not only to image correction but also to upconversion processing (or downconversion processing) of image data. Accordingly, upconversion (or downconversion) of low-definition image data can be performed in accordance with the definition of the display portion DIS, which enables a high-display-quality image to be displayed on the display portion DIS.

Note that for the above-described arithmetic operation of artificial intelligence, the GPU included in the image processing unit GPS can be used, for example. That is, the GPU can be used to perform arithmetic operations for various kinds of correction (e.g., color irregularity correction and upconversion).

Note that in this specification and the like, such a GPU performing an arithmetic operation of artificial intelligence is referred to as an AI accelerator. That is, the GPU may be replaced with an AI accelerator in the description in this specification and the like.

The clock signal generation circuit CKS has a function of generating a clock signal for displaying a desired image on each of the display region ARA[1,1] to the display region ARA[m,n], for example.

In the case where the image rewriting frequency (frame frequency) is different among the display region ARA[1,1] to the display region ARA[m,n], the clock signal generation circuit CKS preferably has a function of generating a clock signal with the frame frequency corresponding to each of the display region ARA[1,1] to the display region ARA[m,n]. That is, the clock signal generation circuit CKS preferably has a function of generating clock signals with different frequencies at the same time.

The distribution circuit DMG has a function of transmitting a signal received from the bus wiring BW to the driver circuit GD for driving pixels included in any one of the display region ARA[1,1] to the display region ARA[m,n], in accordance with the content of the signal.

The distribution circuit DMS has a function of transmitting a signal received from the bus wiring BW to the driver circuit SD for driving pixels included in any one of the display region ARA[1,1] to the display region ARA[m,n], in accordance with the content of the signal.

FIG. 9 illustrates a state where the distribution circuit DMG transmits a signal directly to the circuit GDS; however, the signal transmitted from the distribution circuit DMG may be input to the circuit GDS through the interface INT. Similarly, the distribution circuit DMS transmits a signal directly to the circuit SDS in FIG. 9; however, the signal transmitted from the distribution circuit DMS may be input to the circuit SDS through the interface INT.

Although not illustrated in FIG. 9, a level shifter may be included in the control circuit PRPH. The level shifter has a function of converting signals input to circuits into appropriate levels, for example.

Note that the structure of the control circuit PRPH illustrated in FIG. 9 is an example, and the circuit structure included in the control circuit PRPH may be changed depending on circumstances. For example, in the case where the control circuit PRPH receives driving voltages of circuits from the outside, the control circuit PRPH does not need to generate the driving voltages. In that case, the control circuit PRPH may have a structure without including the voltage generation circuit PG.

For another example, some or all of the circuits included in the control circuit PRPH may be included in the circuit layer SICL of the display apparatus DSP. Specifically, in the case of the display apparatus DSP in FIG. 1A, some or all of the circuits included in the control circuit PRPH may be included in the driver circuit region DRV. In the case of the display apparatus DSP in FIG. 1B, some or all of the circuits included in the control circuit PRPH may be included in the driver circuit region DRV or the region LIA.

Note that the display apparatus of one embodiment of the present invention is not limited to the display apparatus DSP and the display apparatus DSPa described above. At least part of the structure examples, the operation examples, the drawings corresponding thereto, and the like described in this embodiment as an example can be combined with the other structure examples, the other operation examples, the other drawings, and the other embodiments described in this specification and the like as appropriate.

Embodiment 2

In this embodiment, a structure of a display apparatus of one embodiment of the present invention will be described.

<Structure Example of Light-Emitting Element>

First, a light-emitting element (also referred to as a light-emitting device) that can be used for a display apparatus of one embodiment of the present invention will be described. As the light-emitting element, any of a variety of display elements such as an EL element (an EL element containing an organic substance and an inorganic substance, an organic EL element, and an inorganic EL element), a light-emitting diode (LED), a micro LED (e.g., an LED in which the area of a light-emitting region is less than or equal to 10000 $\mu m^2$), a QLED (Quantum-dot Light Emitting Diode), and an electron emitter element can be used, for example. For example, an element including an EL layer (e.g., an organic EL element) may be used as the light-emitting element.

Figure 10A:
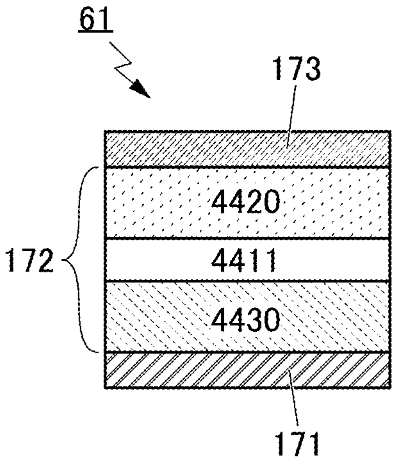
FIG. 10A to FIG. 10D are diagrams illustrating structure examples of a light-emitting element.

As illustrated in FIG. 10A, the light-emitting element 61 includes an EL layer 172 between a pair of electrodes (a conductive layer 171 and a conductive layer 173). The EL layer 172 can be formed with a plurality of layers such as a layer 4420, a light-emitting layer 4411, and a layer 4430, for example. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between the pair of electrodes, can function as a single light-emitting unit. In this specification and the like, the structure in FIG. 10A is referred to as a single structure.

Figure 10B:
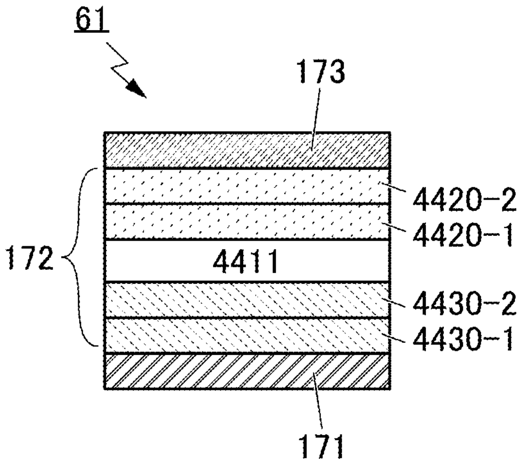

FIG. 10B is a modification example of the EL layer 172 included in the light-emitting element 61 illustrated in FIG. 10A. Specifically, the light-emitting element 61 illustrated in FIG. 10B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 serves as an anode and the conductive layer 173 serves as a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. In the light-emitting element 61 with such a layered structure, carriers can be efficiently injected to the light-emitting layer 4411, and the efficiency of the recombination of carriers in the light-emitting layer 4411 can be enhanced.

Figure 10C:
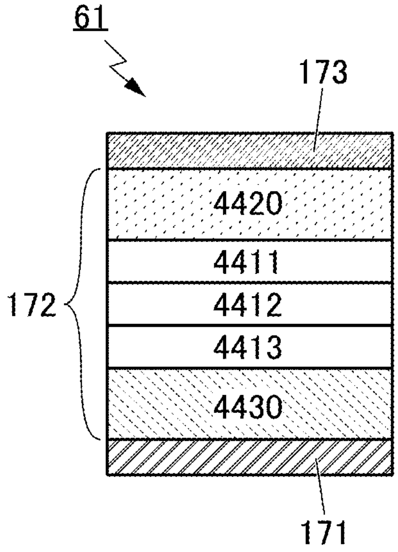

Note that the structure in which a plurality of light-emitting layers (the light-emitting layer 4411, a light-emitting layer 4412, and a light-emitting layer 4413) are provided between the layer 4420 and the layer 4430 as illustrated in FIG. 10C is also an example of the single structure.

Figure 10D:
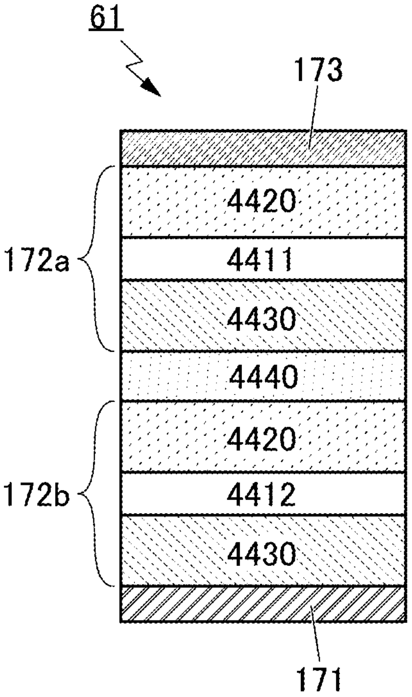

A structure in which a plurality of light-emitting units (an EL layer 172*a* and an EL layer 172*b*) are connected in series with an intermediate layer (charge-generation layer) 4440 therebetween as illustrated in FIG. 10D is referred to as a tandem structure or a stack structure in this specification and the like. Note that the tandem structure enables the light-emitting element 61 capable of high-luminance light emission.

In the case where the light-emitting element 61 has the tandem structure illustrated in FIG. 10D, the EL layer 172*a* and the EL layer 172*b* may emit light of the same color. For example, the EL layer 172*a* and the EL layer 172*b* may both emit green light. Note that in the case where a display region includes three subpixels of R, G, and B and each of the subpixels includes a light-emitting element, the light-emitting element of each subpixels may have the tandem structure. Specifically, the EL layer 172*a* and the EL layer 172*b* in the subpixel of R each contain a material capable of emitting red light. The EL layer 172*a* and the EL layer 172*b* in the subpixel of G each contain a material capable of emitting green light. The EL layer 172*a* and the EL layer 172*b* in the subpixel of B each contain a material capable of emitting blue light. In other words, the light-emitting layer 4411 and the light-emitting layer 4412 may contain the same material. In the light-emitting element 61 having the tandem structure, when the EL layer 172*a* and the EL layer 172*b* emit light of the same color, the current density per unit emission luminance can be reduced. Thus, the reliability of the light-emitting element 61 can be increased.

The emission color of the light-emitting element can be, for example, red, green, blue, cyan, magenta, yellow, white, or the like depending on materials that constitutes the EL layer 172. Furthermore, the color purity can be further increased when the light-emitting element has a microcavity structure.

The light-emitting layer may contain two or more light-emitting substances that emit light of R (red), G (green), B (blue), Y (yellow), or O (orange), for example. The light-emitting element that emits white light preferably contains two or more kinds of light-emitting substances in the light-emitting layer. In the light-emitting element of one embodiment of the present invention, to obtain white light emission with the use of two kinds of light-emitting substances, the two kinds of light-emitting substances may be selected such that their emission colors are complementary colors. For example, in the light-emitting element of one embodiment of the present invention, when an emission color of a first light-emitting substance and an emission color of a second light-emitting substance are complementary colors, it is possible to obtain a light-emitting element which emits white light as a whole. In the light-emitting element of one embodiment of the present invention, to obtain white light emission by using three or more light-emitting substances, the light-emitting element may be configured to emit white light as a whole by combining emission colors of the three or more light-emitting substances.

The light-emitting layer preferably includes two or more light-emitting substances that each emit light containing two or more of spectral components of R, G, and B.

Examples of a light-emitting substance include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

<Structure Example of Display Apparatus>

Next, a structure example of a display device using an element including the above-described EL layer as a light-emitting element is described.

Figure 11:
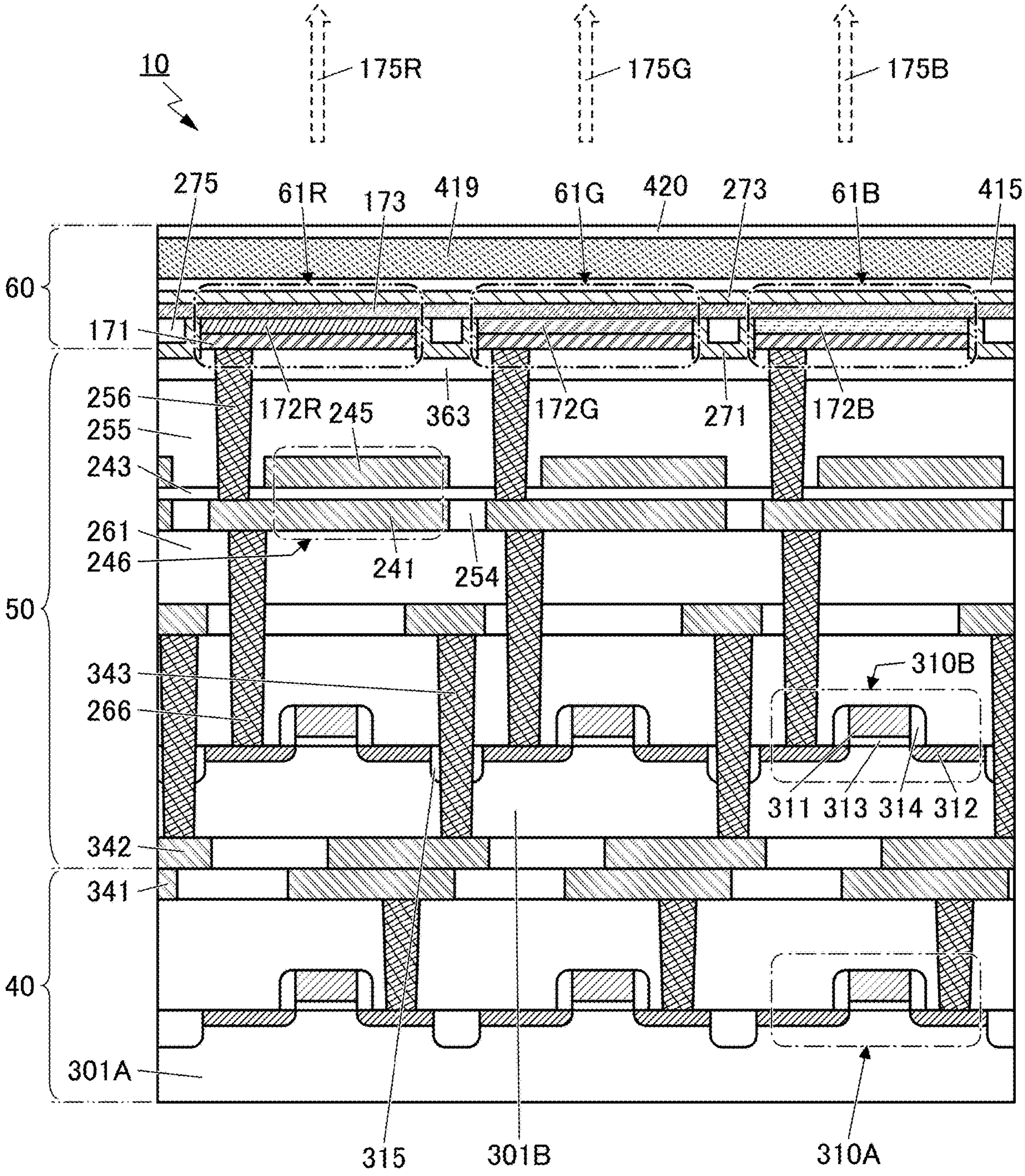
FIG. 11 is a cross-sectional view illustrating an example of a display apparatus.

FIG. 11 illustrates a structure example of a display apparatus of one embodiment of the present invention. A display apparatus 10 illustrated in FIG. 11 has a structure in which a transistor 310A whose channel is formed in a substrate 301A included in a layer 40 and a transistor 310B whose channel is formed in a substrate 301B included in a layer 50 are stacked.

The display apparatus 10 illustrated in FIG. 11 has a structure in which the layer 50 including the substrate 301B, the transistor 310B, and a capacitor 246 and the layer 40 including the substrate 301A and the transistor 310A are attached to each other, and a layer 60 including a light-emitting element 61R, a light-emitting element 61G, and a light-emitting element 61B is provided over an insulating layer 363 included in the layer 50.

The transistor 310B is a transistor including a channel formation region in the substrate 301B. As the substrate 301B, a semiconductor substrate such as a single crystal silicon substrate can be used, for example. The transistor 310B includes part of the substrate 301B, a conductive layer 311, low-resistance regions 312, an insulating layer 313, and an insulating layer 314. The conductive layer 311 functions as a gate electrode. The insulating layer 313 is positioned between the substrate 301B and the conductive layer 311 and functions as a gate insulating layer. The low-resistance region 312 is a region where the substrate 301B is doped with an impurity, and functions as one of a source and a drain. The insulating layer 314 is provided to cover a side surface of the conductive layer 311 and functions as an insulating layer.

An element isolation layer 315 is provided between two adjacent transistors 310B to be embedded in the substrate 301B.

An insulating layer 261 is provided to cover the transistor 310B, and the capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246, the conductive layer 245 functions as the other electrode of the capacitor 246, and the insulating layer 243 functions as a dielectric of the capacitor 246.

The conductive layer 241 is provided over the insulating layer 261 and is embedded in an insulating layer 254. The conductive layer 241 is electrically connected to one of the source and the drain of the transistor 310B through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246, the insulating layer 363 is provided over the insulating layer 255, and the light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B, and a substrate 420 is provided over the top surface of the protective layer 415 with a resin layer 419 therebetween.

The light-emitting element 61R includes an EL layer 172R between the conductive layer 171 functioning as a pixel electrode and the conductive layer 173 functioning as a common electrode. The EL layer 172R contains at least a light-emitting organic compound that emits light with intensity in a red wavelength range. An EL layer 172G included in the light-emitting element 61G contains at least a light-emitting organic compound that emits light with intensity in a green wavelength range. An EL layer 172B included in the light-emitting element 61B contains at least a light-emitting organic compound that emits light with intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film having a light transmitting property with respect to visible light is used as either the conductive layer 171 functioning as a pixel electrode or the conductive layer 173 functioning as a common electrode, and a reflective conductive film is used as the other. When the conductive layer 171 functioning as a pixel electrode has a light-transmitting property and the conductive layer 173 functioning as a common electrode has a reflective property, a bottom-emission display apparatus can be obtained. Alternatively, when the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode have a light-transmitting property, a dual-emission display apparatus can be obtained.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

There is a gap between the EL layers of the light-emitting elements that exhibit two different colors. In this manner, the EL layer 172R, the EL layer 172G, and the EL layer 172B are preferably provided so as not to be in contact with each other. This can favorably prevent unintentional light emission (also referred to as crosstalk) from being caused by current flowing through two adjacent EL layers. As a result, the contrast can be increased, enabling the display apparatus to have high display quality.

A protective layer 271 is provided in a gap between the two EL layers to be adjacent to the side surface of the EL layer 172, the side surface of the conductive layer 171, the side surface of the insulating layer 363, and the top surface of the insulating layer 363. A region 275 is provided between the protective layer 271 and the conductive layer 173. Note that the top surface of the EL layer 172, the top surface of the protective layer 271, and the top surface of the region 275 are provided to be substantially level with each other.

A protective layer 273 is provided over the conductive layer 173, and the protective layer 415 is provided over the protective layer 273.

A protective layer 271 and the protective layer 273 each have a function of preventing diffusion of impurities such as, for example, water into the light-emitting elements from above. A region 275 is preferably filled with a filler (e.g., an epoxy resin, an acrylic resin, a silicone resin, a phenol resin, a polyimide resin, an imide resin, a PVC (polyvinyl chloride) resin, a PVB (polyvinyl butyral) resin, or an EVA (ethylene vinyl acetate) resin).

The conductive layer 171 functioning as the pixel electrode provided in each of the light-emitting element 61R, the light-emitting element 61G, and the light-emitting element 61B is electrically connected to the one of the source and the drain of the transistor 310B through a plug 256 embedded in the insulating layer 243, the insulating layer 255, and the insulating layer 363, the conductive layer 241 embedded in the insulating layer 254, and the plug 266 embedded in the insulating layer 261.

The transistor 310A is a transistor including a channel formation region in the substrate 301A. Therefore, the description thereof may be omitted here because the above description of the transistor 310B can be referred to as appropriate. Note that a material similar to that of the substrate 301B can be used for the substrate 301A.

The substrate 301B is provided with a plug 343 that penetrates the substrate 301B. The plug 343 functions as a Si through electrode (TSV: Through Silicon Via). The plug 343 is electrically connected to a conductive layer 342 provided on the rear surface (the surface that is opposite to the substrate 420 side) of the substrate 301B. Meanwhile, a conductive layer 341 is provided over the insulating layer 261 over the substrate 301A.

The conductive layer 341 and the conductive layer 342 are bonded to each other, whereby the layer 40 and the layer 50 are electrically connected to each other.

The same conductive material is preferably used for the conductive layer 341 and the conductive layer 342. For example, a metal film containing an element selected from Al, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. Copper is particularly preferably used for the conductive layer 341 and the conductive layer 342. In that case, it is possible to employ Cu—Cu (copper-copper) direct bonding (a technique for achieving electrical continuity by connecting Cu (copper) pads) for bonding between the conductive layer 341 and the conductive layer 342. Note that the conductive layer 341 and the conductive layer 342 may be bonded to each other with a bump therebetween.

Note that the structure of electrically connecting the layer 40 and the layer 50 is not limited thereto. For example, layers formed using a material containing Si may be bonded to each other, whereby the layer 40 and the layer 50 may be electrically connected to each other.

Figure 12:
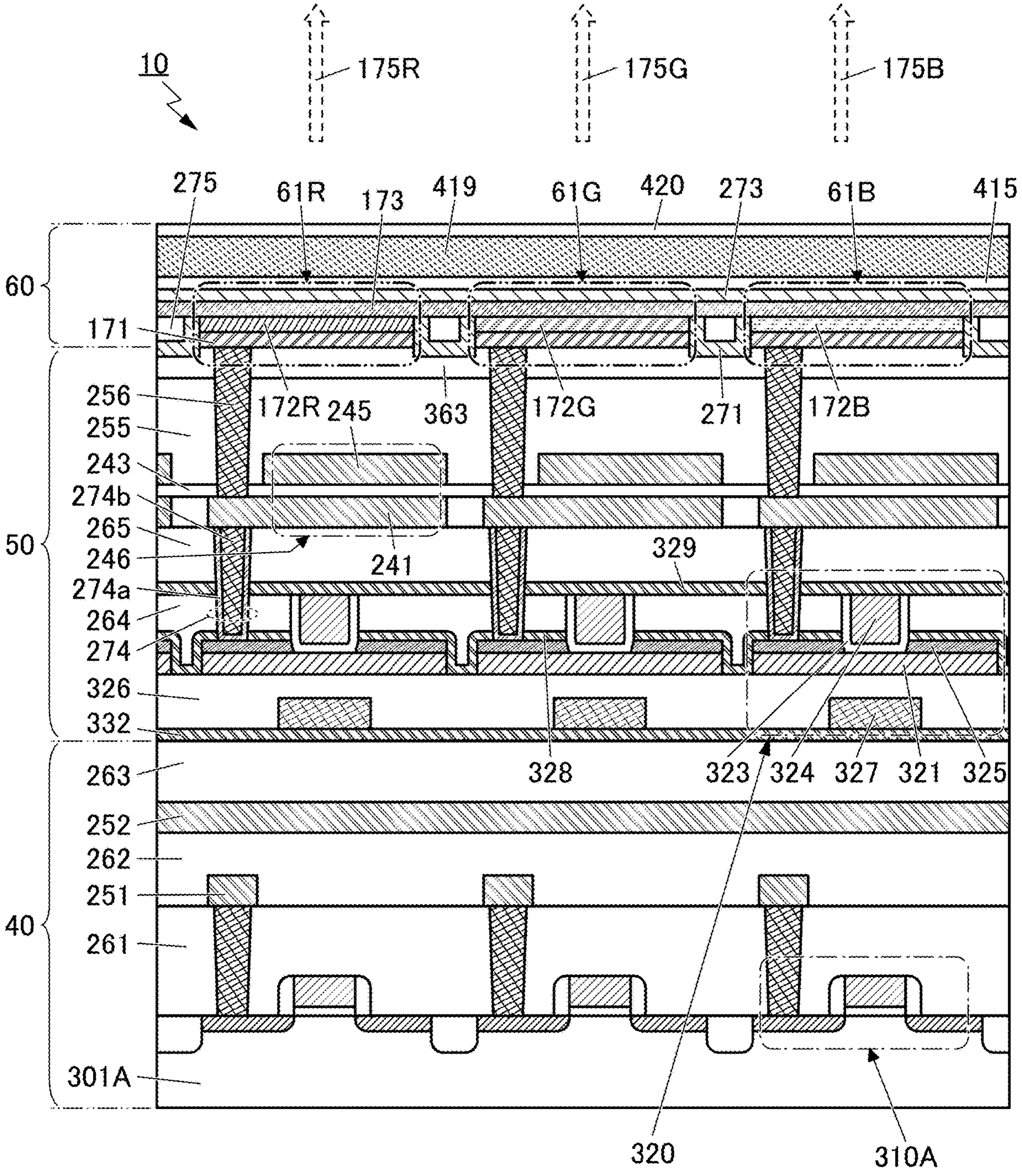
FIG. 12 is a cross-sectional view illustrating an example of a display apparatus.

FIG. 12 illustrates a modification example of the cross-sectional structure example illustrated in FIG. 11. In the cross-sectional structure example of the display apparatus 10 illustrated in FIG. 12, the transistor 310A whose channel is formed in the substrate 301A and a transistor 320 including a metal oxide in a semiconductor layer where a channel is formed are stacked. The cross-sectional structure example of the display apparatus 10 illustrated in FIG. 12 is different from the cross-sectional structure example illustrated in FIG. 11 mainly in that the transistor 320 is provided instead of the transistor 310B. Note that description of portions similar to those in FIG. 11 is sometimes omitted.

In the layer 40 illustrated in FIG. 12, the insulating layer 261 is provided to cover the transistor 310A, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and an insulating layer 332 are provided to cover the conductive layer 252, and the transistor 320 is provided over the insulating layer 332. An insulating layer 265 is provided to cover the transistor 320, and the capacitor 246 is provided over the insulating layer 265. The capacitor 246 and the transistor 320 are electrically connected to each other through a plug 274. The layer 50 is provided to overlap with the insulating layer 263 included in the layer 40.

The transistor 320 is a transistor that includes a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

The insulating layer 332 functions, for example, as a barrier layer that prevents diffusion of impurities such as water or hydrogen from the layer 40 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a second gate electrode of the transistor 320, and part of the insulating layer 326 functions as a second gate insulating layer. An oxide insulating film such as a silicon oxide film is preferably used as at least part of the insulating layer 326 that is in contact with the semiconductor layer 321, for example. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. Materials that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover the top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a first gate electrode, and the insulating layer 323 functions as a first gate insulating layer.

The top surface of the conductive layer 324, the top surface of the insulating layer 323, and the top surface of the insulating layer 264 are planarized such that they are substantially level with each other. An insulating layer 329 and the insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. As the insulating layer 329, an insulating film similar to the insulating layer 328 and the insulating layer 332 can be used.

The plug 274 electrically connected to one of the pair of conductive layers 325 is provided to be embedded in the insulating layer 265, the insulating layer 329, the insulating layer 264, and the insulating layer 328. Here, the plug 274 preferably includes a conductive layer **274*a* that covers side surfaces of each opening of the insulating layer 265, the insulating layer 329, the insulating layer 264, and the insulating layer 328 and part of the top surface of the conductive layer 325, and a conductive layer 274*b* in contact with the top surface of the conductive layer 274*a*. In that case, a conductive material in which hydrogen and oxygen are less likely to diffuse is preferably used for the conductive layer 274*a***.

The transistor 320 can be used as transistors included in the pixel circuit PXC. The transistor 310A can be used as the transistors included in the pixel circuit PXC or transistors included in a peripheral driver circuit. The transistor 310A and the transistor 320 can also be used as transistors included in a functional circuit such as an arithmetic circuit or a memory circuit, for example.

With such a structure, not only the pixel circuit PXC but also the peripheral driver circuit or the like can be formed directly under the layer 60 including the light-emitting element 61, for example. Thus, the display apparatus can be downsized as compared with the case where a driver circuit is provided around a display region.

Figure 13:
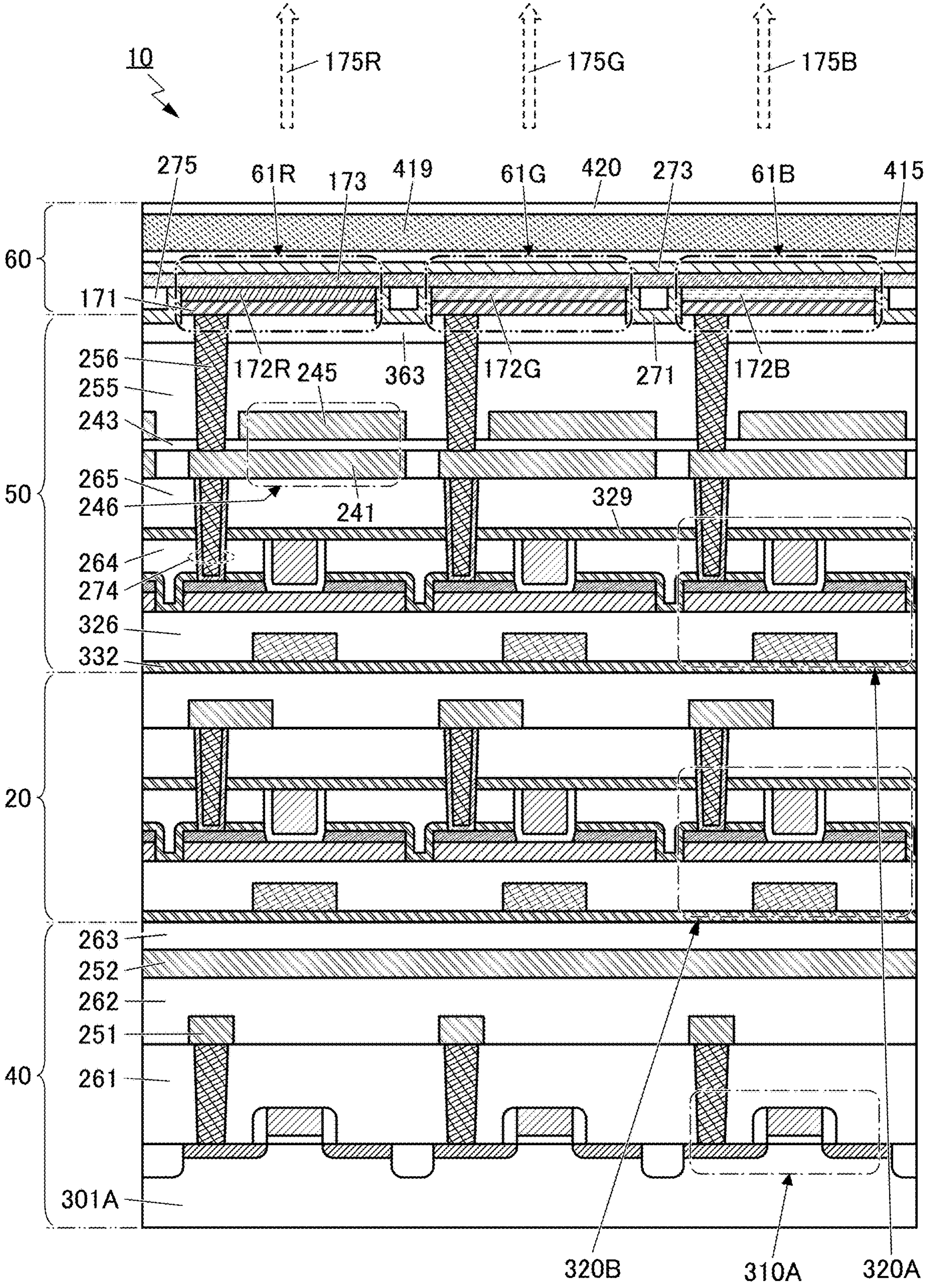
FIG. 13 is a cross-sectional view illustrating an example of a display apparatus.

The cross-sectional structure example of the display apparatus 10 illustrated in FIG. 13 has a structure where the transistor 310A whose channel is formed in the substrate 301A provided in the layer 40, a transistor 320B whose channel is formed in a semiconductor layer including a metal oxide provided in the layer 20, and a transistor 320A whose channel is formed in a semiconductor layer including a metal oxide provided in the layer 50 are stacked. Note that description of portions similar to those in FIG. 11 and FIG. 12 is sometimes omitted.

With this structure, transistors that differ in the composition of the constituent elements in the metal oxide in the semiconductor layer can be used. Thus, the display apparatus can be formed using OS transistors with different transistor characteristics. For example, the transistor 320A of the layer 50 can be used as a transistor of a pixel circuit for driving the light-emitting device. Furthermore, for example, the transistor 320B of the layer 20 can be used as a transistor of a driving signal output circuit included in a driver circuit for driving the pixel circuit.

With such a structure, the circuits provided directly under the light-emitting devices can be arranged with higher density; thus, the display panel can be downsized as compared with the case where a driver circuit is provided around a display region.

<Structure Example 2 of Light-Emitting Element>

Note that the light-emitting element that can be used in the display apparatus of one embodiment of the present invention is not limited to the element with the EL layer as illustrated in FIG. 10A. A light emitting diode (LED) may be used as the light-emitting element.

Figure 14:
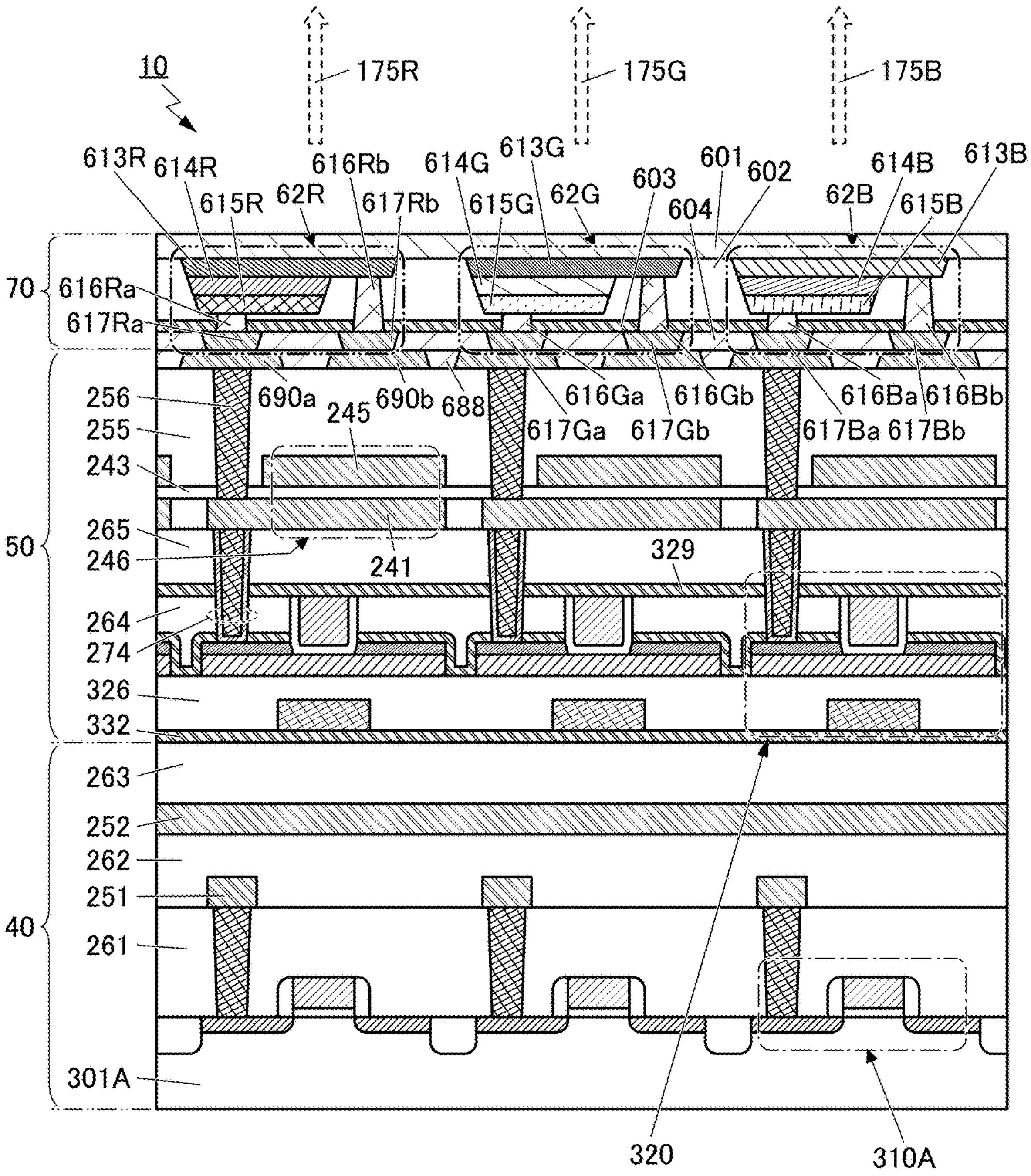
FIG. 14 is a cross-sectional view illustrating an example of a display apparatus.

FIG. 14 illustrates a modification example of the cross-sectional structure example illustrated in FIG. 12. The cross-sectional structure example of the display apparatus 10 illustrated in FIG. 14 has a structure in which a light-emitting diode (LED) is used as the light-emitting element. Note that description of portions similar to those in FIG. 12 is sometimes omitted.

Note that there is no particular limitation on the LED, and for example, a micro LED having a quantum well junction or a nanocolumn LED may be used. The area of a light-emitting region of an LED is preferably less than or equal to 1 $mm^2$, further preferably less than or equal to 10000 $\mu m^2$, still further preferably less than or equal to 3000 $\mu m^2$, even further preferably less than or equal to 700 $\mu m^2$. The area of the region is preferably greater than or equal to 1 $\mu m^2$, preferably greater than or equal to 10 $\mu m^2$, further preferably greater than or equal to 100 $\mu m^2$. Note that in this specification and the like, an LED chip in which the area of a light-emitting region is less than or equal to 10000 $\mu m^2$ is referred to as a micro LED in some cases. An LED in which the area of a light-emitting region is greater than 10000 $\mu m^2$ is referred to as a mini LED in some cases.

The display apparatus 10 illustrated in FIG. 14 has a structure in which the layer 60 illustrated in FIG. 12 is replaced with a layer 70. The layer 70 includes a substrate 601, a light-emitting diode 62R, a light-emitting diode 62G, a light-emitting diode 62B, an insulating layer 602, an insulating layer 603, and an insulating layer 604. The insulating layer 602, the insulating layer 603, and the insulating layer 604 may each have a single-layer structure or a stacked-layer structure.

The light-emitting diode 62R includes a semiconductor layer 613R, a light-emitting layer 614R, a semiconductor layer 615R, a conductive layer 616Ra, a conductive layer 616Rb, an electrode 617Ra, and an electrode 617Rb. The light-emitting diode 62G includes a semiconductor layer 613G, a light-emitting layer 614G, a semiconductor layer 615G, a conductive layer 616Ga, a conductive layer 616Gb, an electrode 617Ga, and an electrode 617Gb. The light-emitting diode 62B includes a semiconductor layer 613B, a light-emitting layer 614B, a semiconductor layer 615B, a conductive layer 616Ba, a conductive layer 616Bb, an electrode 617Ba, and an electrode 617Bb. Each layer included in each of the light-emitting diode 62R, the light-emitting diode 62G, and the light-emitting diode 62B may have a single-layer structure or a stacked-layer structure.

The substrate 601 is provided with the semiconductor layer 613R, the light-emitting layer 614R is provided to overlap with the semiconductor layer 613R, and the semiconductor layer 615R is provided to overlap with the light-emitting layer 614R. The electrode 617Ra is electrically connected to the semiconductor layer 615R through the conductive layer 616Ra. The electrode 617Rb is electrically connected to the semiconductor layer 613R through the conductive layer 616Rb.

The substrate 601 is provided with the semiconductor layer 613G, the light-emitting layer 614G is provided to overlap with the semiconductor layer 613G, and the semiconductor layer 615G is provided to overlap with the light-emitting layer 614G. The electrode 617Ga is electrically connected to the semiconductor layer 615G through the conductive layer 616Ga. The electrode 617Gb is electrically connected to the semiconductor layer 613G through the conductive layer 616Gb.

The substrate 601 is provided with the semiconductor layer 613B, the light-emitting layer 614B is provided to overlap with the semiconductor layer 613B, and the semiconductor layer 615B is provided to overlap with the light-emitting layer 614B. The electrode 617Ba is electrically connected to the semiconductor layer 615B through the conductive layer 616Ba. The electrode 617Bb is electrically connected to the semiconductor layer 613B through the conductive layer 616Bb.

The insulating layer 602 is provided to cover the substrate 601, the semiconductor layer 613R, the semiconductor layer 613G, the semiconductor layer 613B, the light-emitting layer 614R, the light-emitting layer 614G, the light-emitting layer 614B, the semiconductor layer 615R, the semiconductor layer 615G, and the semiconductor layer 615B. The insulating layer 602 preferably has a planarization function. The insulating layer 603 is provided to overlap with the insulating layer 602. The conductive layer 616Ra, the conductive layer 616Rb, the conductive layer 616Ga, the conductive layer 616Gb, the conductive layer 616Ba, and the conductive layer 616Bb are provided to fill openings provided in the insulating layer 602 and the insulating layer 603. It is preferable that the surface of each of the conductive layer 616Ra, the conductive layer 616Rb, the conductive layer 616Ga, the conductive layer 616Gb, the conductive layer 616Ba, and the conductive layer 616Bb on the insulating layer 604 side be substantially level with the surface of the insulating layer 603 on the insulating layer 604 side. The insulating layer 604 is provided to overlap with the insulating layer 603. The electrode 617Ra, the electrode 617Rb, the electrode 617Ga, the electrode 617Gb, the electrode 617Ba, and the electrode 617Bb are provided to fill openings provided in the insulating layer 604. It is preferable that the surface of each of the electrode 617Ra, the electrode 617Rb, the electrode 617Ga, the electrode 617Gb, the electrode 617Ba, and the electrode 617Bb on an insulating layer 688 side be substantially level with the surface of the insulating layer 604 on the insulating layer 688 side.

The insulating layer 602 is preferably formed using an inorganic insulating material such as silicon oxide, silicon oxynitride, silicon nitride oxide, silicon nitride, aluminum oxide, hafnium oxide, or titanium nitride, for example.

As the insulating layer 603, it is possible to use a film through which one or both of hydrogen and oxygen are less likely to diffuse than through a silicon oxide film, such as an aluminum oxide film, a hafnium oxide film, and a silicon nitride film, for example. The insulating layer 603 preferably functions as a barrier layer that prevents diffusion of impurities from the layer 70 into the layer 50.

An oxide insulating film is preferably used as the insulating layer 604. The insulating layer 604 is a layer that is directly bonded to the insulating layer included in the layer 50. The oxide insulating films are directly bonded to each other, whereby the bonding strength (attachment strength) can be increased.

Examples of a material that can be used for each of the conductive layer 616Ra, the conductive layer 616Rb, the conductive layer 616Ga, the conductive layer 616Gb, the conductive layer 616Ba, and the conductive layer 616Bb include metal such as aluminum (Al), titanium, chromium, nickel, copper (Cu), yttrium, zirconium, tin (Sn), zinc (Zn), silver (Ag), platinum (Pt), gold (Au), molybdenum, tantalum, and tungsten (W), and an alloy containing the metal as its main component (e.g., an alloy of silver, palladium (Pd), and copper (Ag—Pd—Cu (APC))). Alternatively, for example, an oxide such as tin oxide or zinc oxide may be used.

For each of the electrode 617Ra, the electrode 617Rb, the electrode 617Ga, the electrode 617Gb, the electrode 617Ba, and the electrode 617Bb, Cu, Al, Sn, Zn, W, Ag, Pt, Au, or the like can be used, for example. Each of the electrode 617Ra, the electrode 617Rb, the electrode 617Ga, the electrode 617Gb, the electrode 617Ba, and the electrode 617Bb is a layer that is directly bonded to the conductive layer included in the layer 50. Preferably, Cu, Al, W, or Au is used for easy bonding.

The light-emitting layer 614R is sandwiched between the semiconductor layer 613R and the semiconductor layer 615R. The light-emitting layer 614G is sandwiched between the semiconductor layer 613G and the semiconductor layer 615G. The light-emitting layer 614B is sandwiched between the semiconductor layer 613B and the semiconductor layer 615B. In each of the light-emitting layer 614R, the light-emitting layer 614G, and the light-emitting layer 614B, electrons and holes are bonded to each other and emit light. Either the semiconductor layer 613R, the semiconductor layer 613G, and the semiconductor layer 613B or the semiconductor layer 615R, the semiconductor layer 615G, and the semiconductor layer 615B are n-type semiconductor layers, and the others are p-type semiconductor layers.

The stacked-layer structure including the semiconductor layer 613R, the light-emitting layer 614R, and the semiconductor layer 615R, the stacked-layer structure including the semiconductor layer 613G, the light-emitting layer 614G, and the semiconductor layer 615G, and the stacked-layer structure including the semiconductor layer 613B, the light-emitting layer 614B, and the semiconductor layer 615B are each formed to exhibit light of red, yellow, green, blue, white, or the like, for example. The stacked-layer structures may be formed to exhibit ultraviolet light. The three stacked-layer structures preferably exhibit light of different colors. For each of the stacked-layer structures, for example, a compound containing a Group 13 element and a Group 15 element (also referred to as a Group 3-5 compound) can be used. Examples of the Group 13 element include aluminum, gallium, and indium. Examples of the Group 15 element include nitrogen, phosphorus, arsenic, and antimony. For the light-emitting diodes to be formed, a compound of gallium and phosphorus, a compound of gallium and arsenic, a compound of gallium, aluminum, and arsenic, a compound of aluminum, gallium, indium, and phosphorus, gallium nitride (GaN), a compound of indium and gallium nitride, a compound of selenium and zinc, or the like can be used, for example.

For example, the light-emitting diode 62R may be formed to exhibit red light, the light-emitting diode 62G may be formed to exhibit green light, and the light-emitting diode 62B may be formed to exhibit blue light. When the light-emitting diode 62R, the light-emitting diode 62G, and the light-emitting diode 62B are formed to exhibit light of different colors, a step of forming a color conversion layer is not necessary. Consequently, the manufacturing cost of the display apparatus can be reduced.

Alternatively, two or more stacked-layer structures may exhibit light of the same color. In this case, light emitted from the light-emitting layer 614R, the light-emitting layer 614G, and the light-emitting layer 614B may be extracted to the outside of the display apparatus through one or both of a color conversion layer and a coloring layer.

The display apparatus of this embodiment may include a light-emitting diode exhibiting infrared light. The light-emitting diode exhibiting infrared light can be used as a light source of an infrared light sensor, for example.

A compound semiconductor substrate may be used as the substrate 601; for example, a compound semiconductor substrate containing a Group 13 element and a Group 15 element may be used. As the substrate 601, a single crystal substrate such as a sapphire ($Al_2O_3$) substrate, a silicon carbide (SiC) substrate, a silicon (Si) substrate, or a gallium nitride (GaN) substrate can be used, for example.

As illustrated in FIG. 14, the light 175R of the light-emitting diode 62R, the light 175G of the light-emitting diode 62G, and the light 175B of the light-emitting diode 62B are emitted toward the substrate 601 side. For that reason, the substrate 601 preferably has a visible-light-transmitting property. The visible-light-transmitting property of the substrate 601 may be increased by thinning the substrate 601 by polishing or the like, for example.

In the layer 50 illustrated in FIG. 14, the top surface of the plug 256 is substantially level with the top surface of the insulating layer 255. The plug 256 functions as a plug that electrically connects the conductive layer 241 and a conductive layer 690*a*. The insulating layer 688 is provided over the insulating layer 255 and the plug 256. The conductive layer 690*a* and a conductive layer 690*b* are provided to fill openings provided in the insulating layer 688. The top surfaces of the conductive layer 690*a* and the conductive layer 690*b* are preferably substantially level with the top surface of the insulating layer 688.

The insulating layer 688 is a layer that is directly bonded to the insulating layer 604 included in the layer 70. The insulating layer 688 is preferably formed using the same material as the insulating layer 604. An oxide insulating film is preferably used as the insulating layer 688. The oxide insulating films are directly bonded to each other, whereby the bonding strength (attachment strength) can be increased. Note that in the case where one or both of the insulating layer 604 and the insulating layer 688 have a stacked-layer structure, layers (including a surface layer and a bonding surface) that are in contact with each other are preferably formed using the same material.

The conductive layer 690*a* included in the layer 50 is a layer that is directly bonded to the electrode 617Ra included in the layer 70. It is preferable that the main component of the conductive layer 690*a* and the main component of the electrode 617Ra be the same metal element, and further preferable that the conductive layer 690*a* and the electrode 617Ra be formed using the same material. For the conductive layer 690*a*, Cu, Al, Sn, Zn, W, Ag, Pt, Au, or the like can be used, for example. Preferably, Cu, Al, W, or Au is used for easy bonding. Note that in the case where one or both of the conductive layer 690*a* and the electrode 617Ra have a stacked-layer structure, layers (including a surface layer and a bonding surface) that are in contact with each other are preferably formed using the same material.

Note that the layer 50 may include one or both of a reflective layer that reflects light of a light-emitting diode and a light-blocking layer that blocks the light.

As illustrated in FIG. 14, the electrode 617Ra provided in the layer 70 is bonded to be electrically connected to the conductive layer 690*a* provided in the layer 50.

The electrode 617Ra functions as a pixel electrode of the light-emitting diode 62R. The electrode 617Rb and the conductive layer 690*b* are connected to each other. The electrode 617Rb functions as a common electrode of the light-emitting diode 62R.

The electrode 617Ra and the conductive layer 690*a* preferably contain the same metal elements as main components.

Although bonding between the electrode 617Ra and the conductive layer 690*a* is described here, the electrode 617Ga and the electrode 617Ba are also bonded to the conductive layer 690*a* in a similar manner as illustrated in FIG. 14. Note that it is preferable that the conductive layer 690*a* bonded to the electrode 617Ra, the conductive layer 690*a* bonded to the electrode 617Ga, and the conductive layer 690*a* bonded to the electrode 617Ba be not electrically connected to each other.

The insulating layer 604 provided in the layer 70 and the insulating layer 688 provided in the layer 50 are directly bonded to each other. The insulating layer 604 and the insulating layer 688 are preferably formed of the same component or material.

The layers formed using the same material are in contact with each other at the bonding surface between the layer 70 and the layer 50, whereby connection with mechanical strength can be obtained.

For bonding metal layers to each other, for example, it is possible to use a surface activated bonding method in which an oxide film, a layer adsorbing impurities, and the like on the surface are removed by sputtering treatment or the like and the cleaned and activated surfaces are brought into contact to be bonded to each other. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

For bonding insulating layers to each other, for example, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained. In the case of using an oxide insulating film, hydrophilicity treatment is preferably performed, in which case the bonding strength can be further increased. Note that in the case where an oxide insulating film is used, hydrophilicity treatment is not necessarily performed separately.

A combination of two or more of bonding methods may be used for the bonding because both the insulating layer and the metal layer exist at the bonding surface between the layer 70 and the layer 50. For example, a surface activated bonding method and a hydrophilic bonding method can be performed in combination.

For example, it is possible to use a method in which the surfaces are made clean after polishing, the surfaces of the metal layers are subjected to anti-oxidation treatment and then hydrophilicity treatment, and bonding is performed. Furthermore, hydrophilicity treatment may be performed on the surfaces of the metal layers being hardly oxidizable metal such as Au, for example. In the case where hydrophilicity treatment is not performed, antioxidant treatment can be omitted and there is no limitation on the kinds of the materials, so that the manufacturing cost and the number of manufacturing steps can be reduced. Note that a bonding method other than the above methods may be used.

Note that the attachment between the layer 70 and the layer 50 is not necessarily direct bonding over the entire surfaces of the substrates; the substrates may be connected to each other in at least part of the substrates with a conductive paste of silver, carbon, copper, or the like, or a bump of gold, solder, or the like.

The structures and the like described in this embodiment can be used in appropriate combination with any of the structures and the like described in the other embodiments and the like.

Embodiment 3

In this embodiment, a metal oxide (hereinafter also referred to as an oxide semiconductor) that can be used for the OS transistor described in the above embodiment will be described.

The metal oxide used for the OS transistor preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and is further preferably gallium.

For example, the metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) structures, and the like can be given as examples of a crystal structure of an oxide semiconductor.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, the In—Ga—Zn oxide film deposited at room temperature is in an intermediate state, which is neither a single crystal nor polycrystal nor an amorphous state. Therefore, it is difficult to conclude that In—Ga—Zn oxide film is in an amorphous state.

[Structure of Oxide Semiconductor]

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductors include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a plurality of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Note that indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS, for example.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. For example, a pentagonal lattice arrangement, a heptagonal lattice arrangement, and the like are included in the distortion in some cases. Note that it is difficult to observe a clear grain boundary even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region includes indium oxide, indium zinc oxide, or the like as its main component, for example. The second region includes gallium oxide, gallium zinc oxide, or the like as its main component, for example. That is, the first region can be rephrased as a region containing In as its main component. The second region can be rephrased as a region containing Ga as its main component.

Note that in some cases, it is difficult to observe a clear boundary between the first region and the second region.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure where metal elements are unevenly distributed.

The CAC-OS can be formed by a sputtering method under a condition where a substrate is not heated intentionally, for example. Furthermore, in the case where the CAC-OS is formed by a sputtering method, any one or more selected from an inert gas (typically, argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region is a region having a higher insulating property than the first region. In other words, when the second regions are distributed in a metal oxide, leakage current can be inhibited.

Thus, in the case where the CAC-OS is used for a transistor, a switching function (on state/off state switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, high on-state current ($I_{on}$), a high field-effect mobility (μ), and favorable switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for the semiconductor layer where a channel is formed. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor, the impurity concentration in the oxide semiconductor is reduced so that the density of defect states in the oxide semiconductor can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the oxide semiconductor is set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

The structures and the like described in this embodiment can be used in appropriate combination with any of the structures and the like described in the other embodiments and the like.

Embodiment 4

In this embodiment, electronic devices in which the display apparatus of one embodiment of the present invention can be used will be described.

The display apparatus of one embodiment of the present invention can be used for a display portion of an electronic device. Thus, one embodiment of the present invention can achieve an electronic device having high display quality. Alternatively, one embodiment of the present invention can achieve an electronic device with extremely high definition. Alternatively, one embodiment of the present invention can achieve a highly reliable electronic device.

Examples of electronic devices using the display apparatus or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The display apparatus of one embodiment of the present invention can display a high-resolution image. Thus, the display apparatus can be suitably used especially for a portable electronic device, a wearable electronic device (wearable device), an e-book reader, or the like. For example, the display apparatus can be suitably used for xR devices such as a VR device and an AR device.

Figure 15A:
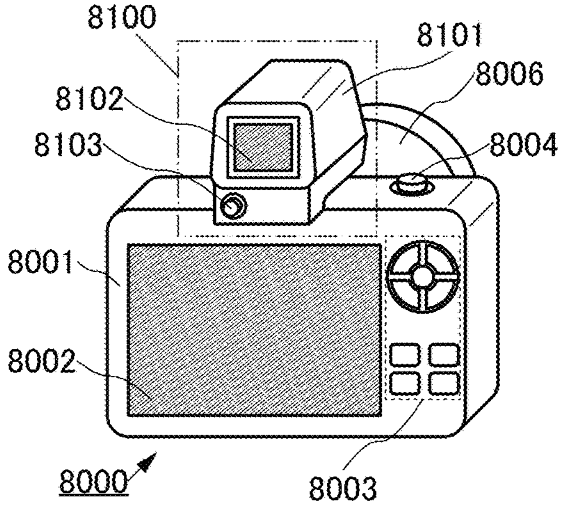
FIG. 15A to FIG. 15F are diagrams illustrating examples of electronic devices.

FIG. 15A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The display apparatus of one embodiment of the present invention can be used in the display portion 8002 of the camera 8000 and the display portion 8102 of the finder 8100. Note that the finder 8100 may be incorporated in the camera 8000.

Figure 15B:
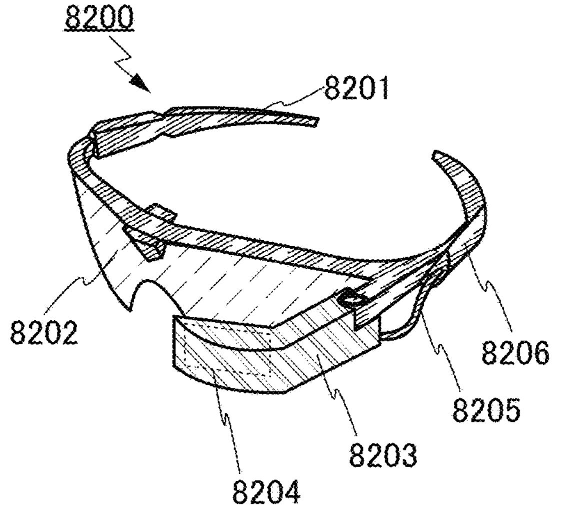

FIG. 15B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The display apparatus of one embodiment of the present invention can be used in the display portion 8204.

Figure 15C:
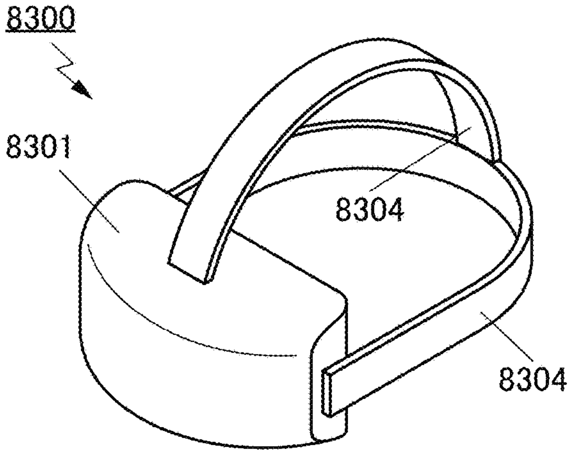
Figure 15D:
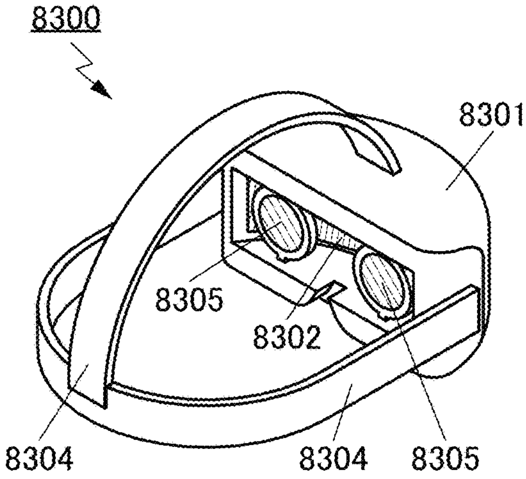
Figure 15E:
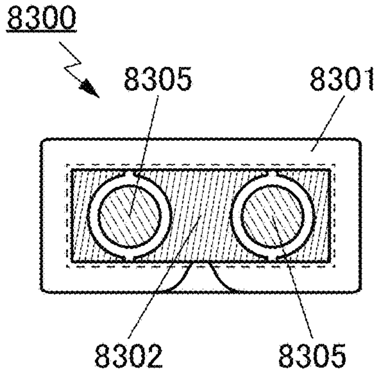

FIG. 15C to FIG. 15E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The display apparatus of one embodiment of the present invention can be used for the display portion 8302. The display apparatus of one embodiment of the present invention can achieve extremely high resolution. For example, a pixel is not easily seen by the user even when the user sees display that is magnified by the lenses 8305 as illustrated in FIG. 15E. That is, an image with a strong sense of reality can be seen by the user with the use of the display portion 8302.

Figure 15F:
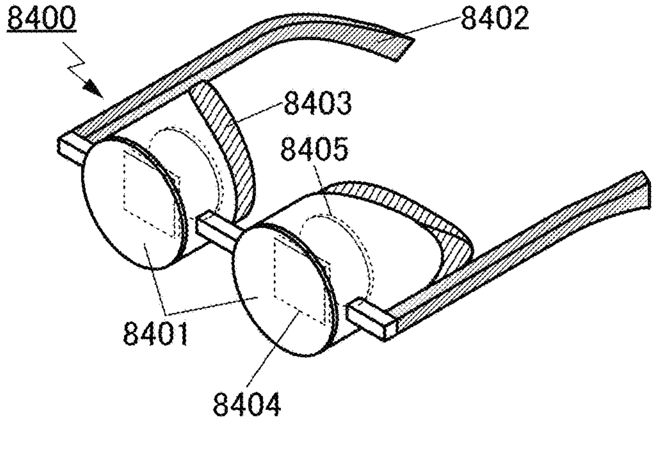

FIG. 15F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

The display apparatus of one embodiment of the present invention can be used in the display portion 8404.

Figure 16A:
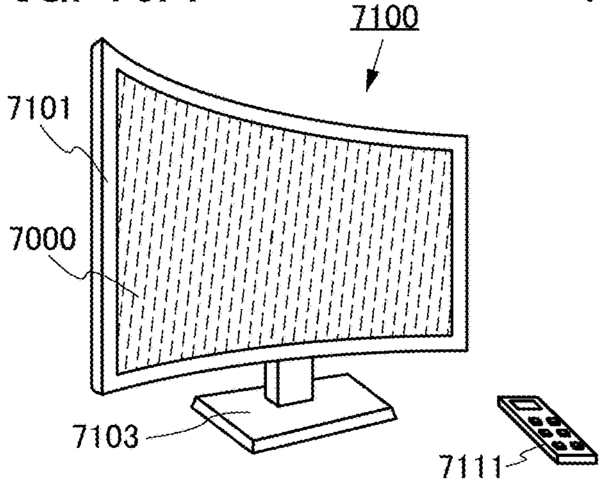
FIG. 16A to FIG. 16F are diagrams illustrating examples of electronic devices.

FIG. 16A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000 in FIG. 16A.

Operation of the television device 7100 illustrated in FIG. 16A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

Figure 16B:
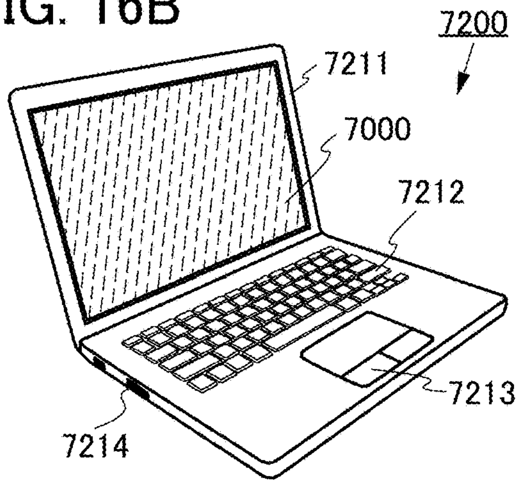

FIG. 16B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000 in FIG. 16B.

Figure 16C:
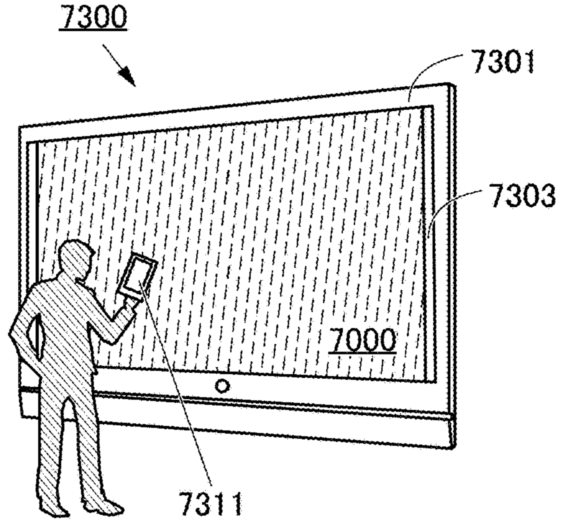
Figure 16D:
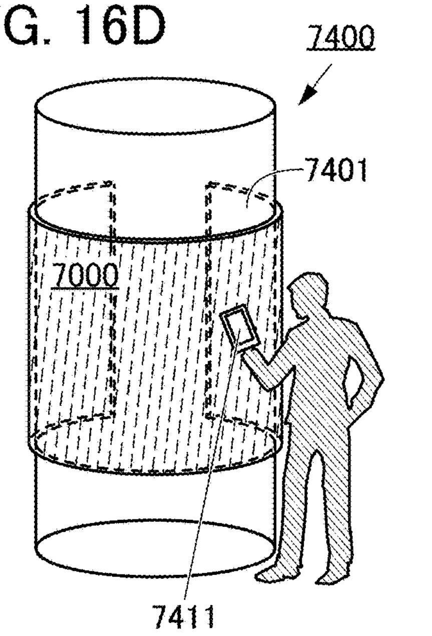

FIG. 16C and FIG. 16D illustrate examples of digital signage.

Digital signage 7300 illustrated in FIG. 16C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 16D illustrates digital signage 7400 attached to a cylindrical pillar. The digital signage 7400 includes the display portion 7000 provided along a curved surface of the pillar 7401.

In FIG. 16C and FIG. 16D, the display apparatus of one embodiment of the present invention can be used for the display portion 7000.

The digital signage 7300 or the digital signage 7400 including a larger area of the display portion 7000 can increase the amount of information that can be provided at a time. The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 16C and FIG. 16D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 16E:
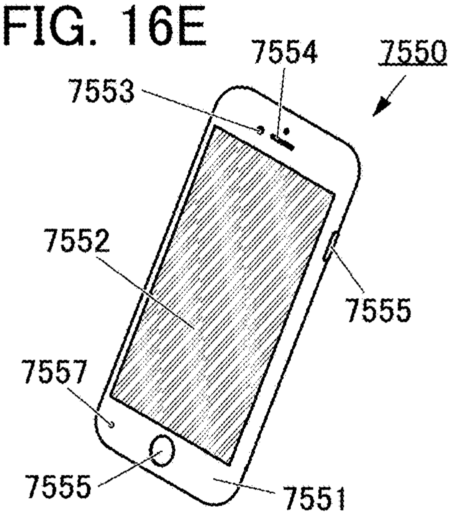

FIG. 16E illustrates an example of an information terminal. An information terminal 7550 includes a housing 7551, a display portion 7552, a microphone 7557, a speaker portion 7554, a camera 7553, operation switches 7555, and the like. The display apparatus of one embodiment of the present invention can be used for the display portion 7552. The display portion 7552 can have a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

Figure 16F:
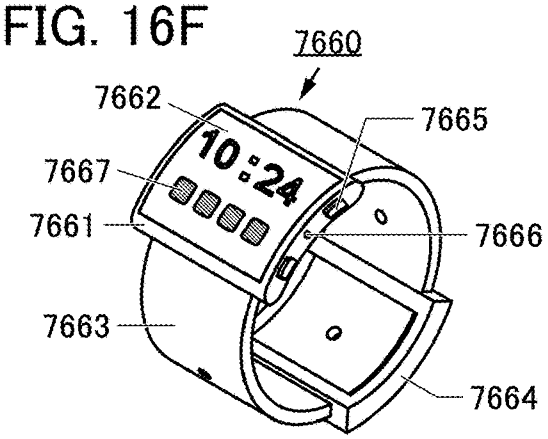

FIG. 16F illustrates an example of a watch-type information terminal. An information terminal 7660 includes a housing 7661, a display portion 7662, a band 7663, a buckle 7664, an operation switch 7665, an input/output terminal 7666, and the like. The display apparatus of one embodiment of the present invention can be used for the display portion 7662. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 17A:
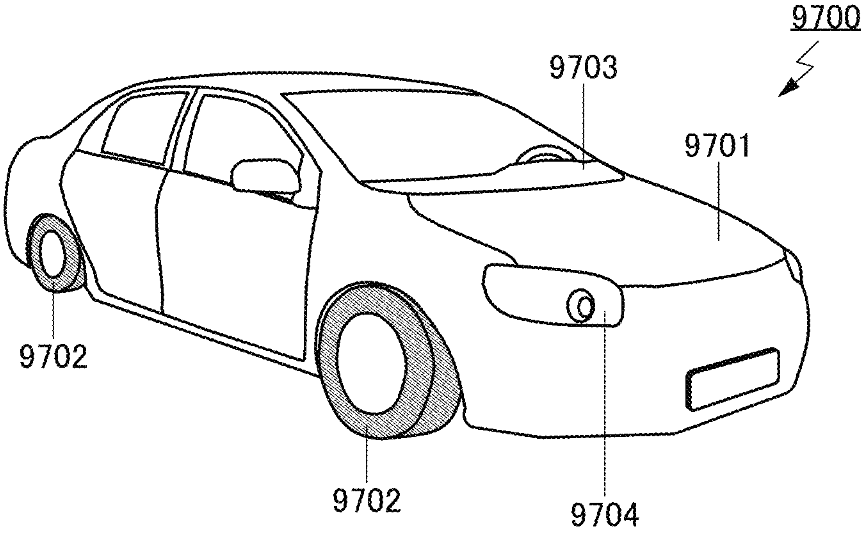
FIG. 17A and FIG. 17B are diagrams illustrating examples of electronic devices.
Figure 17B:
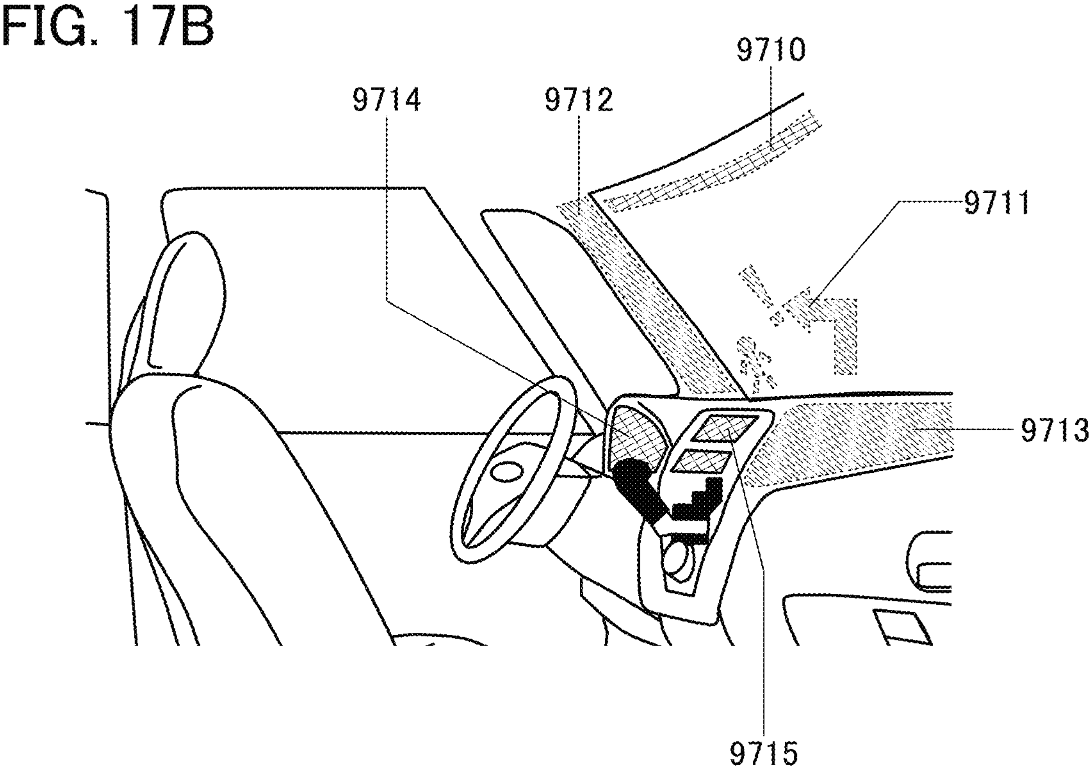

FIG. 17A is an external view of an automobile 9700. FIG. 17B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 17B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 18:
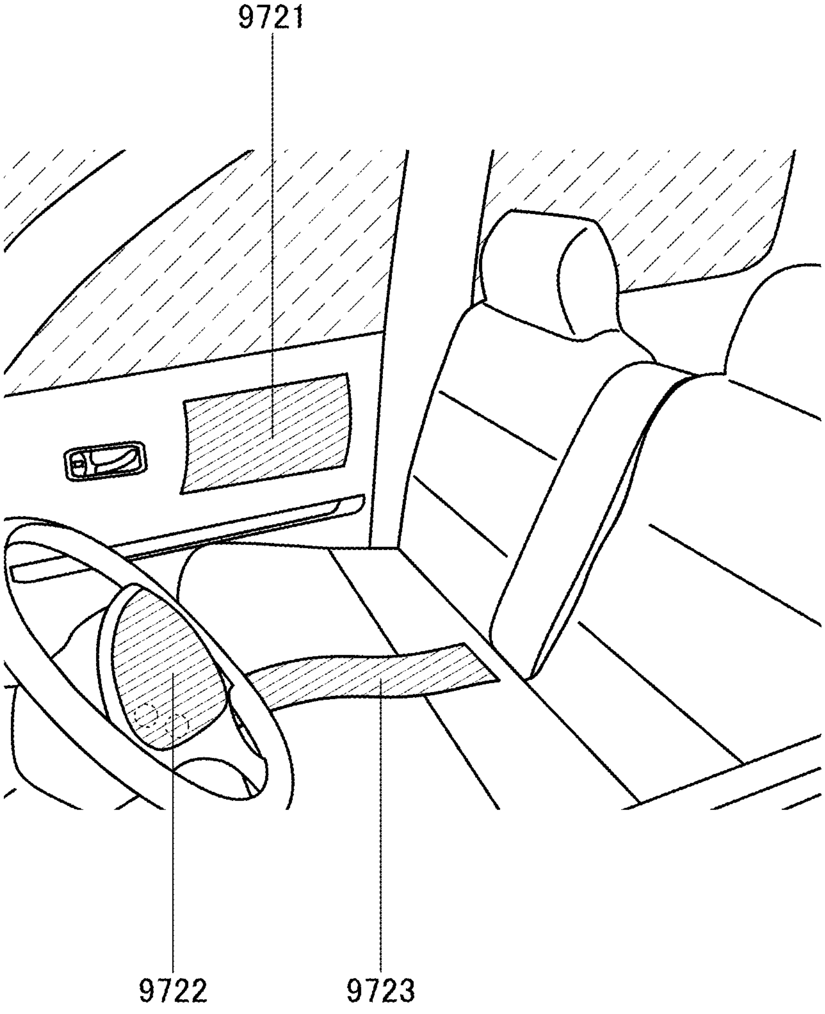
FIG. 18 is a diagram illustrating examples of electronic devices.

FIG. 18 illustrates the inside of the automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat. The display apparatus of one embodiment of the present invention can be used for each of the display portion 9721 to the display portion 9723.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structures and the like described in this embodiment can be used in appropriate combination with any of the structures and the like described in the other embodiments and the like.

REFERENCE NUMERALS

DSP: display apparatus, PXAL: pixel layer, SICL: circuit layer, BS: substrate, DRV: driver circuit region, DIS: display portion, ARA: display region, ARD: circuit region, SD: driver circuit, GD: driver circuit, PX: pixel, GL: wiring, SL: wiring, LIA: region, DSPa: display apparatus, DISa: display portion, R: row, T11: period, T12: period, T13: period, S11: operation, S12: operation, S13: operation, PXa: pixel, PXC: pixel circuit, D1: light-emitting element, M1: transistor, M2: transistor, M3: transistor, M4: transistor, C1: capacitor, GLa: wiring, GLb: wiring, GLc: wiring, AN: wiring, CA: wiring, ML: wiring, Vdata: image signal, H: potential, L: potential, V0: potential, OSPL: layer, EML: layer, OSCL: circuit layer, SIPL: layer, LS: level shifter, PRPH: control circuit, GDS: circuit, SDS: circuit, DMG: distribution circuit, DMS: distribution circuit, CTR: control unit, MD: memory device, PG: voltage generation circuit, TMC: timing controller, CKS: clock signal generation circuit, GPS: image processing unit, INT: interface, BW: bus wiring, 10: display apparatus, 20: layer, 40: layer, 50: layer, 60: layer, 61: light-emitting element, 70: layer, 246: capacitor, 275: region, 301A: substrate, 301B: substrate, 310A: transistor, 310B: transistor, 320: transistor, 320A: transistor, 320B: transistor, 420: substrate, 601: substrate, 4420: layer, 4430: layer

The invention claimed is:

1. A method for driving a display apparatus;

the display apparatus comprising:

a first layer comprising a plurality of driver circuit regions; and a second layer over the first layer, the second layer comprising a plurality of display regions, wherein each of the plurality of driver circuit regions comprises a driver circuit, wherein each of the plurality of display regions comprises a plurality of pixels, wherein each of the plurality of pixels comprises a light-emitting element, and wherein the driver circuit included in one of the plurality of driver circuit regions is configured to drive each of the plurality of pixels included in one of the plurality of display regions, the method for driving the display apparatus, comprising the steps of:

performing a first operation in which an operation of sequentially writing an image signal row by row in each of the plurality of display regions is performed and the operation is performed in all the plurality of display regions at the same time;

performing a second operation in which the light-emitting elements included in the plurality of pixels are brought into a light-emitting state simultaneously after the first operation; and performing a third operation in which the light-emitting elements included in the plurality of pixels are brought into a non-light-emitting state simultaneously after the second operation.

2. The method for driving the display apparatus, according to claim 1, wherein the second layer comprises a transistor comprising a metal oxide in a channel formation region.

3. The method for driving the display apparatus, according to claim 1, wherein the first layer comprises a transistor comprising silicon in a channel formation region.

4. The method for driving the display apparatus, according to claim 1, wherein the light-emitting element is an organic EL element.

5. The method for driving the display apparatus, according to claim 1, wherein the light-emitting element is a light-emitting diode.

6. A display apparatus comprising:

a first layer comprising a plurality of driver circuit regions; and a second layer over the first layer, the second layer comprising a plurality of display regions, wherein each of the plurality of driver circuit regions comprises a driver circuit, wherein each of the plurality of display regions comprises a plurality of pixels, wherein each of the plurality of pixels comprises a light-emitting element, and wherein the driver circuit included in one of the plurality of driver circuit regions is configured to drive each of the plurality of pixels included in one of the plurality of display regions, the display apparatus configured to:

perform a first operation in which an operation of sequentially writing an image signal row by row in each of the plurality of display regions is performed and the operation is performed in all the plurality of display regions at the same time;

perform a second operation in which the light-emitting elements included in the plurality of pixels are brought into a light-emitting state simultaneously after the first operation; and perform a third operation in which the light-emitting elements included in the plurality of pixels are brought into a non-light-emitting state simultaneously after the second operation.

7. The display apparatus according to claim 6, wherein the second layer comprises a transistor comprising a metal oxide in a channel formation region.

8. The display apparatus according to claim 6, wherein the first layer comprises a transistor comprising silicon in a channel formation region.

9. The display apparatus according to claim 6, wherein the light-emitting element is an organic EL element.

10. The display apparatus according to claim 6, wherein the light-emitting element is a light-emitting diode.

* * * * *